United States Patent
Johnson et al.

(10) Patent No.: US 6,797,454 B1
(45) Date of Patent: Sep. 28, 2004

(54) METHOD AND APPARATUS FOR THERMAL PROCESSING A PHOTOSENSITIVE ELEMENT

(75) Inventors: Melvin Harry Johnson, Claremont, CA (US); David Anthony Belfiore, Kennett Square, PA (US); Mark A. Hackler, Ocean, NJ (US); Anandkumar Ramakrishnan Kannurpatti, East Windsor, NJ (US); Robert Lee Brown, Newark, DE (US); Stephen Cushner, Lincroft, NJ (US); Robert Finley Drury, East Windsor, NJ (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 107 days.

(21) Appl. No.: 10/069,426
(22) PCT Filed: Sep. 6, 2000
(86) PCT No.: PCT/US00/24400
§ 371 (c)(1),
(2), (4) Date: Feb. 19, 2002
(87) PCT Pub. No.: WO01/18604
PCT Pub. Date: Mar. 15, 2001

Related U.S. Application Data
(60) Provisional application No. 60/152,660, filed on Sep. 7, 1999.

(51) Int. Cl.$^7$ .................................................. G03F 7/34
(52) U.S. Cl. ...................... 430/306; 430/309; 430/330; 430/348; 430/413; 101/463.1
(58) Field of Search ................... 430/348, 270.1, 430/271.1, 273.1, 281.1, 286.1, 287.1, 288.1, 306, 309, 330, 401, 413, 644, 945; 101/463.1

(56) References Cited

U.S. PATENT DOCUMENTS

| | | | |
|---|---|---|---|
| 3,060,023 A | | 10/1962 | Burg et al. |
| 5,175,072 A | * | 12/1992 | Martens ...................... 430/254 |
| 5,279,697 A | * | 1/1994 | Peterson et al. ............ 156/358 |
| 2002/0009672 A1 | * | 1/2002 | Daems et al. ............ 430/273.1 |
| 2003/0180655 A1 | * | 9/2003 | Fan et al. ................ 430/270.1 |

FOREIGN PATENT DOCUMENTS

| | | |
|---|---|---|
| EP | 0468745 A2 | 1/1992 |
| EP | 0469735 A2 | 2/1992 |

* cited by examiner

*Primary Examiner*—Barbara Gilliam
(74) *Attorney, Agent, or Firm*—Thomas H. Magee

(57) ABSTRACT

A method and apparatus for thermal processing a photosensitive element includes heating a composition layer on a flexible substrate to a melt temperature of an unirradiated area of the composition layer and maintaining the flexible substrate at a temperature below the melt temperature while pressing a heated absorbent layer against the heated composition layer, and repeating these steps for multiple cycles. A further embodiment of the method includes a step of cooling the flexible substrate and layer laminate on each cycle to maintain the flexible substrate at the desired temperature below that of the heated composition layer.

19 Claims, 16 Drawing Sheets

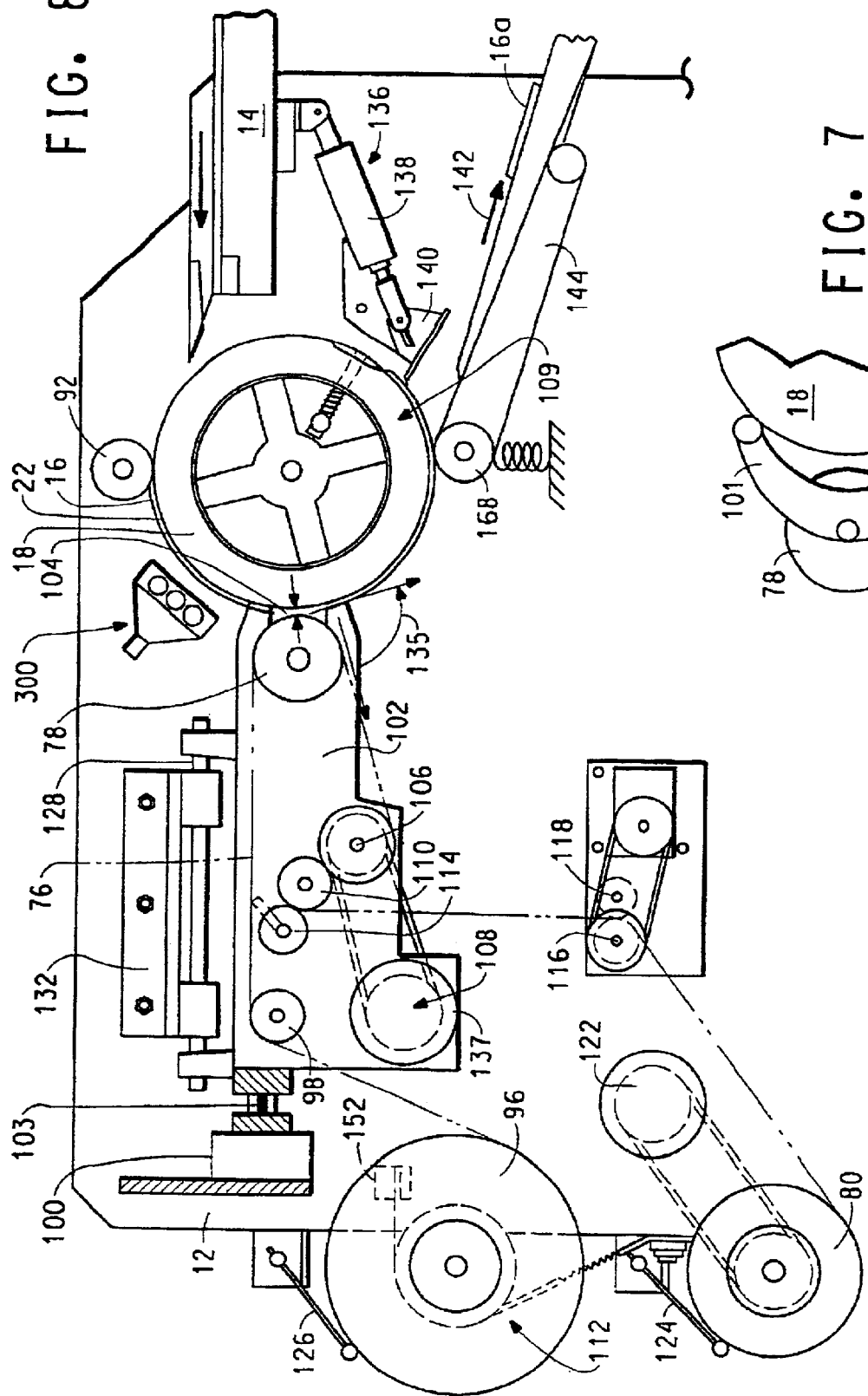

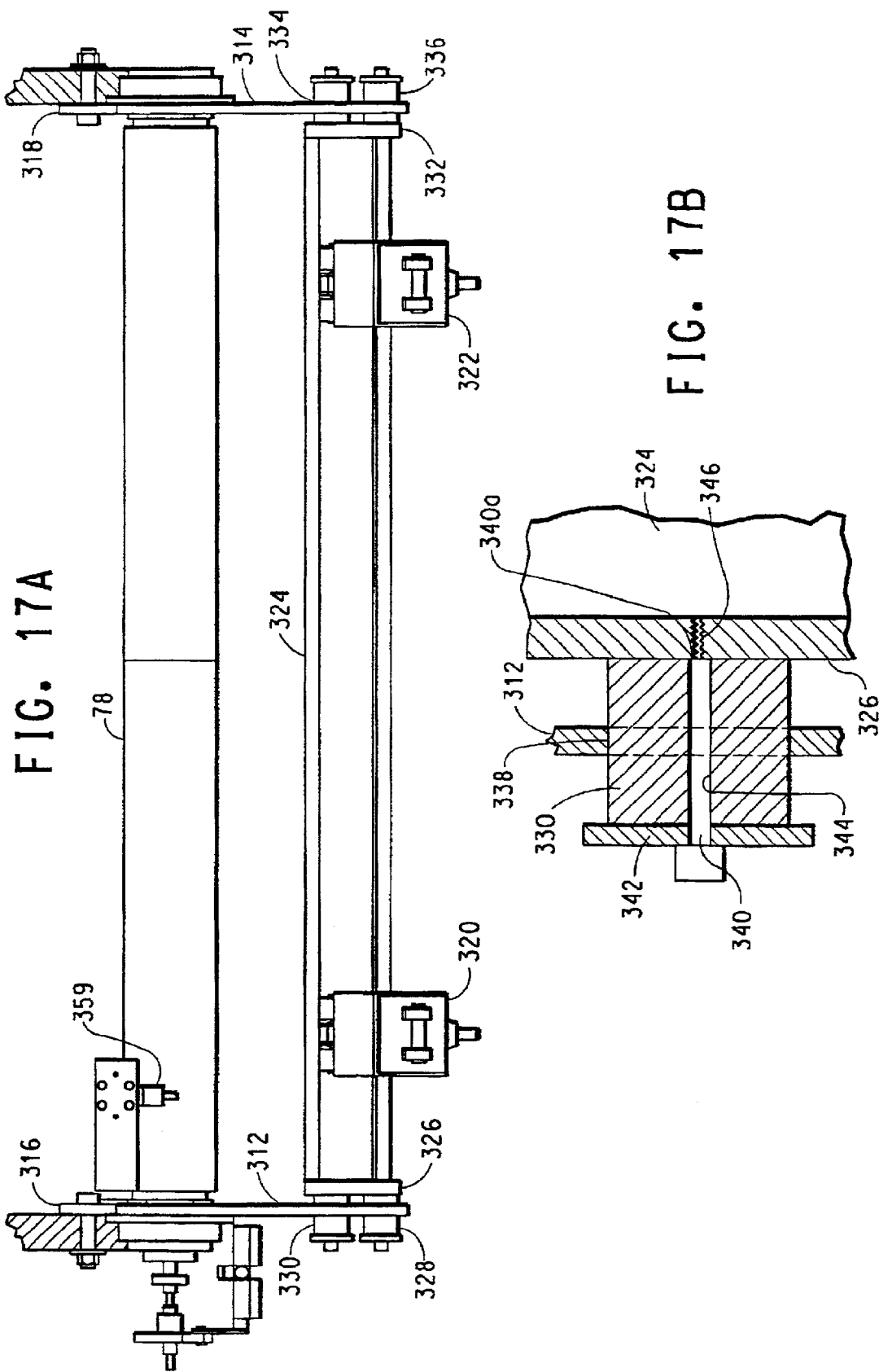

METHOD AND APPARATUS FOR THERMAL PROCESSING A PHOTOSENSITIVE ELEMENT

This application claims benefit of 60/152,660 filed Sep. 7, 1999.

BACKGROUND OF THE INVENTION

The invention pertains to a process and apparatus for processing a photosensitive element using a thermal process without the use of solvents to form a relief pattern and, in particular, to a process and apparatus for thermal development of the photosensitive element to form a flexographic printing plate.

Burg et al. in U.S. Pat. No. 3,060,023 describe a process for transferring images from photopolymerized image-bearing elements to a receptor surface using a dry thermal process. A film support with a photopolymerizable stratum is exposed to an image to provide exposed areas that do not melt and "underexposed" areas that can melt and transfer to an image receptive element. In numerous examples, a paper image receptive element is placed in contact with the stratum surface on a film support and heat is applied by a hot flat heating element pressing against the film support to heat the assemblage. In some examples, an unheated assemblage is passed between two rollers, one of which is heated. The paper is stripped from the stratum while still warm, and the transfer of the unexposed material of the stratum to the paper element is effected. Multiple copies of the image on the paper can be obtained by repeating the thermal transfer process. In a few examples, the thermal transfer is accomplished by heating the paper and pressing it into intimate contact with the stratum. It is suggested without further explanation, that ". . . heat can be applied at any stage of the process prior to the separation step to either or both elements provided the transfer temperatures correspond to at least the softening temperature of the photopolymerizable stratum. Heat can be applied by means well known in the art, e.g., rollers, flat or curved heating surfaces or platens, radiant sources, e.g., heating lamps, etc.". Heating times varied in the examples from 0.5 seconds to 10 seconds. Typical film thicknesses are 1 mil to 4 mils and stratum thicknesses are 0.5 mil to 4 mils. In a few examples, it is disclosed that the film support, with a relief image in the stratum, could be further treated with actinic light and used for printing in a rotary press to make copies.

U.S. Pat. No. 5,175,072 issued to Martens describes a thermal process for manufacturing a flexographic printing plate by providing a radiation hardenable composition as a layer on a flexible substrate, imagewise irradiating the composition to harden the composition in irradiated areas, heating the composition layer to a temperature of between 40° C. and 200° C. to soften the unirradiated area, contacting the composition layer with an absorbent layer which can absorb the softened unirradiated area which is able to flow into the absorbent layer, and removing the absorbent layer, thereby removing the absorbed flowable composition from the unirradiated areas of the composition on the flexible substrate. This leaves behind on the substrate a raised relief structure of irradiated, hardened composition that represents the irradiated image. This relief area becomes the ink receptive surface that both receives ink from an inking roll in a printing process and transfers the ink to the printing substrate during the printing operation. The process can also utilize a predevelopment step that can improve the adhesion of the irradiated, hardened composition to the flexible substrate by first developing a "floor" of hardened composition on the substrate. This is accomplished by transmitting ionizing radiation through the flexible substrate to polymerize a layer of composition adjacent the flexible substrate. This layer is not removed during the imagewise development and removal of the unirradiated composition.

During the heating process, a laminate comprising the flexible substrate, the composition layer, and the absorbent layer are heated by placing them on a heated platen with the flexible substrate, a polyester film, in contact with the platen. The absorbent layer comprises a non-woven nylon web. After a few seconds of warm-up time to allow the laminate to equilibrate with the platen temperature of about 135° C., the laminate is passed between two heated, rubber covered, nip rolls moving in a counter-rotating speed at about 30 cm/minute. The rolls are gapped apart so as to lightly compress the laminate as it is introduced into the gap. As the laminate exits the nip rolls, the absorbent layer is lifted from the heated composition surface with steady tension. The unirradiated areas of the composition are removed via absorption into the non-woven web. The heating and pressing steps are repeated several times until at least 75% of the unirradiated composition is removed from the unirradiated areas. It is desireable that the flexible substrate and the irradiated, hardened composition is stable at the elevated temperatures required to remove the unirradiated composition so that the flexible substrate and hardened composition are not distorted by more than 2% in any surface dimension.

U.S. Pat. No. 5,279,697 issued to Peterson et al. describes an automated process and apparatus for handling an irradiated printing element and accomplishing repeated heating and pressing to remove the unirradiated composition from the element. The element comprising the flexible film substrate and composition layer, with irradiated and unirradiated areas, is mounted on a preheating drum that is heated with an electrically heated blanket mounted on an inner surface of a main wall of the drum. The heat must travel through the wall of the drum and through the flexible substrate to preheat the composition layer to a temperature near the melt point of the unirradiated area.

A continuous sheet of absorbent layer of non-woven nylon web is pulled from a supply roll and passed over a hot roll to heat the web. The hot roll is urged toward the preheating drum, thereby pressing the heated web against the preheated composition layer of the printing element on the preheating drum. The heat in the absorbent web is transferred to the printing element upon contact so the temperature of the flexible film is raised to a temperature sufficient to enable the unirradiated portions of the composition layer to liquefy and be absorbed into the absorbent layer of non-woven web. The hot roll may be heated by an electrical core heater or by other means that might use steam, oil, hot air, or the like to provide a temperature sufficient to melt a portion of the composition on the flexible film. As the preheating drum and hot roll rotate in contact together, the web is pressed against the printing element to absorb the liquefied unirradiated composition and is then pulled away from the printing element, thereby separating the absorbed composition from the printing element. The web is transported away from the hot roll and is rewound for waste removal or recycling. Several cycles of passing the printing element past the hot roll are repeated to progressively remove most of the unirradiated composition from the printing element. When the unirradiated composition is removed, a printing plate with a raised relief of hardened irradiated area results that is suitable for the printing process. In some cases a final irradiation of the printing element is carried out to harden any residual unirradiated composition.

In the methods and apparatuses disclosed above to Burg et al., Martens, and Peterson et al., the common practice is to heat the film substrate to a temperature near the melting point of the unirradiated composition. However, heating the film substrate can undesirably distort the substrate to the extent that it may affect the quality of the relief area of the printing plate that becomes apparent during printing. It is common that the temperature of the film substrate gradually increases with each repeat of the heating and absorbing cycle, so by the last cycle, the film substrate is almost at the melt point of the unirradiated composition. The problem presented by substrate distortion is that for a three or four color printing process, three or four plates must be made with images that register exactly for the different colors to come together and produce an accurate final image. If one of the plates distorts in one direction and the other distorts in another direction, the images will not register correctly to produce a quality color print. It is common that the substrates have shrinkage characteristics when heated that are non-uniform in the x and y planar directions due to manufacturing procedures. Typically, the substrate shrinks more in the machine direction of manufacture than in the cross-machine direction. It is believed that a substrate shrinkage of 0.1% is the most allowable at the temperatures the substrate sees during plate development; and preferably, the shrinkage should be less than 0.02% for high quality multi-plate color printing. The substrate shrinkage must also be compatible with the composition coated onto the substrate so wrinkles in the completed photosensitive element do not appear. It is difficult to provide a substrate that has low shrinkage at the temperatures required for thermal imaging of a photosensitive element.

In the method of Burg et al., the film and stratum thicknesses are generally too thin for robust printing plates and there is no method or apparatus taught for rapidly producing a thick, robust, printing plate suitable for commercial application. Where Burg et al. heats only the paper, the process removes only a small quantity of stratum necessary to create an image on the paper.

There is a need for an improved process and apparatus of the type described by Peterson et al. that rapidly heats a substantial thickness of the composition layer to the required temperature while limiting unnecessary heating of the flexible film substrate. There is a need to control accumulated heating of the flexible film substrate with each cycle of heating and absorbing.

SUMMARY OF THE INVENTION

The invention is a method of heating a composition layer on a flexible substrate to the melt temperature of an unirradiated area of the composition layer and maintaining the flexible substrate at a temperature below the melt temperature of an unirradiated area of the composition layer while pressing a heated absorbent layer against the still hot composition layer, and repeating these steps for multiple cycles. A further embodiment of the method includes a step of cooling the flexible substrate and layer laminate to maintain the flexible substrate at the desired temperature below that of the heated composition layer.

The invention is an apparatus for forming a relief pattern and, in particular, a flexographic printing plate, from a photosensitive element comprising a flexible substrate having an exterior surface and an interior surface, and a composition layer on the substrate capable of being partially liquefied, the composition layer having an exterior surface and an interior surface, with the composition layer and flexible substrate joined at their respective interior surfaces, comprising:

a roller mounted for rotation in a first frame portion for supplying an absorbent material to the exterior surface of the composition layer;

a drum mounted for rotation in a second frame portion with means for supporting the photosensitive element on an outer circumferential surface of the drum with the exterior surface of the flexible substrate contacting said outer surface, the drum positioned for delivering the photosensitive element to the absorbent material, wherein at least one of the first and second frame portions are movable relative to the other;

first heating means for applying heat to the exterior surface of the composition layer on the drum adjacent where the absorbent material contacts the layer at the roller, the first heating means adapted to heat the exterior surface of the layer to a temperature T1 which is equal to or greater than a temperature T2 sufficient to cause a portion of the layer to liquefy, while maintaining the exterior surface of the flexible substrate at a temperature T3 at least 20° F. below temperature T1;

second heating means for heating the roller to a temperature capable of heating the exterior surface of the composition layer to a temperature T4 which is equal to or greater than temperature T2 while the absorbent material is contacting the exterior surface of the layer and while maintaining the exterior surface of the flexible substrate at the temperature T3 which is at least 20° F. below temperature T4;

pressure means for causing the photosensitive element and the absorbent material to come into contact between the drum and the roller at a pressure sufficient for at least a portion of the liquefied material of the composition layer to be absorbed by the absorbent material; and separation means for separating the photosensitive element from the absorbent material.

A further embodiment of the apparatus includes a forced cooling means for cooling the photosensitive element where the element is separated from the absorbent material.

BRIEF DESCRIPTION OF THE DRAWINGS

FIG. 7 is a detailed side elevational view of a pressure limiting device of an embodiment of the present invention.

FIG. 8 is a side cross-sectional view partially in schematic of the present invention with the hot roller engaged.

FIG. 17A is an end view of the hot roller of the second embodiment.

FIG. 17B is an enlarged cross-section view of a resilient mounting for the actuators for the hot roller of the second embodiment.

DETAILED DESCRIPTION OF THE PREFERRED EMBODIMENT(S)

Figure 1:
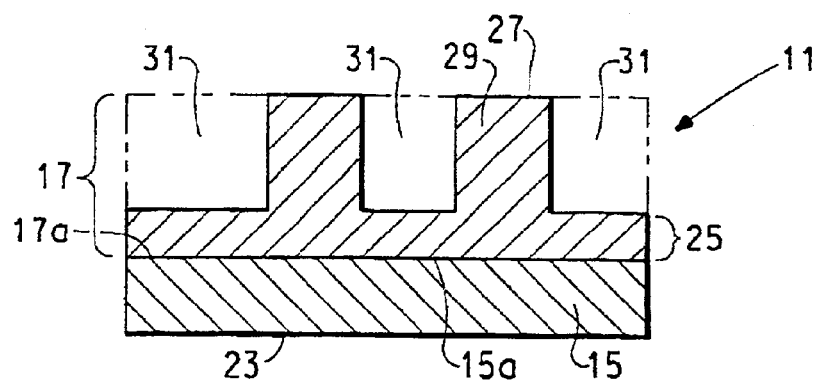
FIG. 1 is a partial cross-sectional view of a formed printing plate, showing a multilayered construction.

The present invention is an apparatus and process for thermal developing a photosensitive element. The apparatus of the present invention is not limited to thermal developing a photosensitive element, preferably to form a flexographic printing plate. The present invention contemplates an apparatus capable of heating a photosensitive element having a layer of composition capable of being partially liquefied to a temperature sufficient to melt at least a portion of the layer for any purpose. One additional such purpose is to form a relief pattern of fluid channels in a surface to be used in a lamination to form fluidic circuits for use in fluidic control devices. Another additional such purpose is to form a holographic diffraction grating by utilizing an embossed relief pattern.

The photosensitive element includes a flexible substrate and a composition layer mounted on the substrate, the composition layer comprising at least one layer on the substrate capable of being partially liquefied. Preferably, the photosensitive element is an elastomeric printing element suitable for use as a flexographic printing plate. The at least one layer on the substrate is preferably a photosensitive layer, and most preferably a photopolymerizable layer of an elastomeric composition wherein the photosensitive layer can be selectively cured by actinic radiation. As used herein, the term "photopolymerizable" encompasses systems which are photopolymerizable, photocrosslinkable, or both. In cases where the composition layer comprises more than one photosensitive layers on the flexible substrate, the composition of each of the photosensitive layers can be the same or different from any of the other photosensitive layers.

A non-limiting example of an elastomeric composition comprises a thermoplastic elastomeric block copolymer mixed with at least one monomer and a photoinitiator. The elastomeric block copolymer is preferably an A—B—A type block copolymer, where A represents a nonelastomeric block, preferably a vinyl polymer and most preferably polystyrene, and B represents an elastomeric block, preferably polybutadiene or polyisoprene. The nonelastomer to elastomer ratio is preferably in the range of from 10:90 to 35:65. The at least one monomer in this embodiment may be an ethylenically unsaturated compound with at least one terminal ethylenic group that is compatible with the block copolymer, e.g., multifunctional acrylates or methacrylates, polyacryloyl oligomers. Examples of compounds suitable as monomer include, but is not limited to, ethylene glycol diacrylate, hexanediol diacrylate, diethylene glycol diacrylate, glycerol diacrylate, trimethylol propane triacrylate, hexanediol dimethacrylate, glycerol triacrylate, trimethylolpropane triacrylate, ethylene glycol dimethacrylate, 1,3-propanediol dimethacrylate, 1,2,4-butanetrioltrimethacrylate, and 1,4-butanediol diacrylate. A mixture of monofunctional and multifunctional acrylates or methacrylates may be used. If a polyacrylol oligomer is used, that oligomer should preferably have a molecular weight greater than 1000.

Other suitable photosensitive elastomers that may be used include polyurethane elastomers. An example of a suitable polyurethane elastomer is the reaction product of (i) an organic diisocyanate, (ii) at least one chain extending agent having at least two free hydrogen groups capable of polymerizing with isocyanate groups and having at least one ethylenically unsaturated addition polymerizable group per molecule, and (iii) an organic polyol with a minimum molecular weight of 500 and at least two free hydrogen containing groups capable of polymerizing with isocyanate groups. For a more complete description of these materials see U.S. Pat. Nos. 5,015,556 and 5,175,072.

The photosensitive elastomeric layer should include a photoinitiator. The photoinitiator is a compound that generates free radicals upon exposure to actinic radiation. Any of the known classes of photoinitiators, particularly free radical photoinitiators such as quinones, benzophenones, benzoin ethers, aryl ketones, peroxides, biimidazoles, diaryliodoniums, triarylsulfoniums, and phosphoniums, and diazoniums, may be used. Alternatively, the photoinitiator may be a mixture of compounds, one of which provides the free radicals when caused to do so by a sensitizer activated by radiation.

Additional additives to the photosensitive layer include colorants, processing aids, antioxidants, and antiozonants. Processing aids may be such things as low molecular weight polymers compatible with the elastomeric block copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

A release layer may be included on the photosensitive layer on the side opposite the flexible substrate. The release layer enables the easy removal of a mask used for the imagewise exposure of the photosensitive element. The release layer must be flexible, transparent, coatable, and nontacky. A thin layer, preferably having a thickness of at least 0.5 microns, but less than 10 microns, more preferably less than 4 microns, is suitable. The release layer preferably is removable by contact with an absorbent material in the range of acceptable developing temperatures for the flexographic printing element used. Suitable release layers may include polyamides and hydroxy cellulosic polymers. An example of a suitable release layer is disclosed by Wang in EP 0 665 471.

The photosensitive element may include as the composition layer one or more other layers on the photosensitive layer on the side opposite the flexible substrate. In addition to the release layer, other layers on the photosensitive layer include elastomeric capping layer, and infrared-sensitive layer and combinations thereof. One or more of the additional other layers can cover or only partially cover the photosensitive layer. Suitable compositions for the elastomeric capping layer and methods for forming the layer on the element are disclosed as elastomeric compositions in a multilayer cover element described in Gruetzmacher et al., U.S. Pat. Nos. 4,427,759 and 4,460,675. The elastomeric capping layer is similar to the photosensitive layer in that after imagewise exposure the elastomeric capping layer is at least partially removable by contact with an absorbant material in the range of acceptable temperatures for the photosensitive element used. The infrared-sensitive layer can be on the photosensitive layer, or on a barrier layer which is on the photosensitive layer, or on another support which together with the photosensitive element form an assemblage. Each of the release layer and elastomeric capping layer can function as the barrier layer when the release and/or capping layer/s is disposed between the infrared-sensitive layer and the photosensitive layer. The infrared-sensitive layer is substantially opaque to actinic radiation (e.g., has an optical density of ≧2.5) and can be imaged with infrared laser radiation. The infrared-sensitive layer can be ablated (i.e., vaporized or removed) from the photosensitive layer on the side opposite the flexible substrate by exposure to infrared laser radiation. Alternately, when the photosensitive element forms an assemblage with the support carrying the infrared-sensitive layer, the infrared-sensitive layer can be transferred from the support to the external surface (the side opposite the flexible substrate) of the photosensitive layer by exposure to infrared laser radiation. The infrared-sensitive layer can be used alone or with other layers, e.g., ejection layer, heating layer, etc. The infrared-sensitive layer generally comprises an infrared-absorbing material, a radiation-opaque material, and an optional binder. Dark inorganic pigments, such as carbon black and graphite, generally function as both infrared-sensitive material and radiation-opaque material. The thickness of the infrared-sensitive layer should be in a range to optimize both sensitivity and opacity, which is generally from about 20 Angstroms to about 50 micrometers, preferably 4 Angstroms to 40 micrometers. Such infrared-sensitive photoablative or phototransferable layer can be employed in digital direct-to-plate image technology in which the exposure by laser radiation removes or transfers the infrared-sensitive layer to form an in-situ mask on the photosensitive element. Suitable infrared-sensitive compositions, elements, and their preparation are disclosed in U.S. Pat. Nos. 5,262,275; 5,719,009; 5,607,814; 5,506,086; 5,766,819; 5,840,463; and EP 0 741 330 A1. The infrared-sensitive layer preferably is removable by contact with an absorbent material in the range of acceptable developing temperatures for the photosensitive element used.

Additional intermediate photosensitive layers may be used to adjust adhesion, hardness, and thickness of the flexographic printing element. One or more priming or adhesive layers may be included between the substrate and the at least one layer capable of being partially liquefied. Examples of suitable primer layers are disclosed by Prioleau et al. in U.S. Pat. No. 5,187,044 and Wang in U.S. Pat. No. 5,534,391. The photosensitive element can also include one or more other layers such as an antistatic layer as disclosed by Kausch et al. in U.S. Pat. No. 5,322,761.

The photosensitive element of the present invention may further include a temporary coversheet on top of the uppermost layer of the photosensitive element, which uppermost layer may be the at least one photopolymerizable layer, or the additional layers such as the release layer, the elastomeric capping layer, and the infrared-sensitive layer. One purpose of the coversheet is to protect the uppermost layer of the photosensitive element during storage and handling. It is important in digital plate processing that the coversheet be removed prior to exposing the infrared-sensitive layer to infrared laser radiation. Examples of suitable materials for the coversheet include thin films of polystyrene, polyethylene, polypropylene, polycarbonate, fluoropolymers, polyamide or polyesters, which can be subbed with release layers. The coversheet is preferably prepared from polyester, such as Mylar® polyethylene terephthalate film; most preferably the coversheet is 2-mil Mylar®.

The photosensitive elastomeric composition is preferably capable of partially liquefying upon thermal development. That is, during thermal development the uncured elastomeric composition must soften or melt at a reasonable processing or developing temperature but not be subject to cold flow, i.e., dimensional change, during normal storage.

The flexible substrate can be a self-supporting polymeric film. By the term "self-supporting" it is meant that the film does not have to be supported by a web or other carrier. The substrate can contain almost any polymeric material that forms films that are non-reactive and remain stable throughout the processing conditions. Examples of suitable film supports include cellulosic films and thermoplastic materials such as poly olefins, polycarbonates, and polyester. Linear polyesters are preferred, particularly polyethylene terephthalate (PET). Other linear, crystalline polyester films can also serve as base film substrate. Further examples of materials suitable as the flexible substrate include transparent foams and fabrics, and metals such as aluminum and steel. The flexible substrate is selected to be tear resistant and must have a fairly high melt point, for example, above the melt temperature of the composition layer formed on the flexible substrate.

The flexible substrate of the photosensitive element has a thickness of between about 0.01 mm and about 0.38 mm, with a preferred thickness of about 0.13 mm (5 mils). The radiation curable composition layer is between about 0.35 mm and about 7.6 mm thick, with a preferred thickness of about 0.5 mm to 3.9 mm (20 to 155 mils) with a particularly preferred thickness of about 0.5 mm to 1.7 mm thick (20 to 67 mils). The total composite sheet thickness is between about 0.48 mm and about 7.8 mm, with a preferred thickness of about 0.60 mm to 4 mm.

FIG. 1 shows a photosensitive element 11 with portions that are removed in the developing process shown in dot and dash lines. The photosensitive element 11 has a flexible substrate 15. The substantially uniform composition layer 17 is applied onto the flexible substrate 15 and may itself comprise several layers. The composition layer 17, formed of a radiation curable elastomeric polymer, may be adhesively or chemically bonded to the flexible substrate 15. The flexible substrate in combination with the radiation curable polymer together forms the photosensitive element 11. The flexible substrate 15 has an exterior surface 23 and an interior surface 15a that is bonded to an interior surface 17a of composition layer 17 which also has an exterior surface 27.

To prepare the photosensitive element for thermal developing, the photosensitive element is exposed to actinic radiation from exterior surface 23 of the flexible substrate 15 to chemically cross-link and cure a portion of the composition layer 17 adjacent interior surface 17a to form a floor layer 25. The thickness of the floor 25 depends upon the plate thickness and relief depth required for the particular printing application, and can be accomplished by varying exposure conditions and thermal processing conditions. This step would be omitted if the flexible substrate is a material opaque to actinic radiation. Next, photosensitive element is imagewise exposed to actinic radiation from the opposite exterior surface 27 to cure desired portions of the photosensitive element. After imagewise exposure, a photosensitive element 16 is formed of cured portions in the exposed areas of the radiation curable composition layer 17 and uncured portions in the unexposed areas of the radiation curable composition layer 17. The uncured portions have a thickness between about 0.18 mm and about 6.22 mm.

Conventionally, the exposure of the photosensitive element through the flexible substrate 23 to establish the floor layer 25 (so called backflash exposure) is done prior to imagewise exposure of the opposite exterior surface 27 of the photosensitive element. However, it is also possible, and generally preferred, to reverse the order of the two exposures, that is, the imagewise exposure is done prior to the backflash exposure, as described by Schober et al. in U.S. Pat. No. 5,552,263.

Imagewise exposure can be carried out by exposing the photosensitive element through an image-bearing mask. The image-bearing mask, a black and white transparency or negative containing the subject matter to be printed, can be made from silver halide films or other means known in the art. The mask is placed on top of the plate after first stripping off the temporary coversheet. Image-wise exposure can be carried out in a vacuum frame, which provides proper contact of the mask and the top surface of the plate, and removes atmospheric oxygen. The plate is then exposed to actinic radiation. On exposure, the transparent areas of the negative (i.e., mask) allow addition polymerization or crosslinking to take place, while the actinic radiation opaque areas remain uncrosslinked. Exposure is of sufficient duration to crosslink the exposed areas down to the support or to the back exposed layer (floor). Imagewise exposure time is typically much longer than backflash time, and ranges from a few to tens of minutes. For direct-to-plate image formation as disclosed in U.S. Pat. Nos. 5,262,275; 5,719,009; 5,607,814; van Zoeren, U.S. Pat. Nos. 5,506,086; 5,766,819; 5,840,463 and EP 0 741 330 A1, the presence of the infrared-sensitive layer is required. An image-bearing mask of a layer which is radiation opaque and infrared-sensitive is formed in-situ on the external surface of the photosensitive element using an infrared laser exposure engine. Imagewise exposure of photosensitive elements through such an in-situ mask can be done without using a vacuum frame, simplifying the printing plate making process. The exposure process involves (1a) imagewise ablating the infrared-sensitive layer of the photosensitive element described above to form a mask, or (1b) imagewise transfering the infrared-sensitive layer from a support in an assemblage to the external surface of the photosensitive element; and (2) overall exposing the photosensitive element to actinic radiation through the mask. The imagewise laser exposure can be carried out using various types of infrared lasers, which emit in the range 750 to 20,000 nm, preferably in the range 780 to 2,000 nm. Diode lasers may be used, but Nd:YAG lasers emitting at 1060 nm are preferred.

Actinic radiation sources encompass the ultraviolet, visible and infrared wavelength regions. The suitability of a particular actinic radiation source is governed by the photosensitivity of the initiator and the at least one monomer used in preparing the flexographic printing plates from the photosensitive element. The preferred photosensitivity of most common flexographic printing plates are in the UV and deep visible area of the spectrum, as they afford better room-light stability.

The portions 29 of the composition layer 17 that are exposed to radiation chemically cross-link and cure. The cured irradiated portions have an elevated melting temperature, and are insoluble in flexographic printing inks under normal conditions. "Normal" conditions include flexographic plate temperatures of between about 12° C. and 31° C. The portions of the composition layer that are unirradiated (unexposed) are not cured and have a lower melting temperature than the cured irradiated portions. The imagewise exposed photosensitive element 16 is then ready for heat development to form a relief pattern.

An absorbent material is selected having a melt temperature exceeding the melt temperature of the unirradiated or uncured portions of the radiation curable composition and having good tear resistance at the same operating temperatures. Preferably, the selected material withstands temperatures required to process the photosensitive element during heating. The photosensitive element composition layer 17 is heated to between 40 and 200° C. (104–392° F.) while in contact with the absorbent material. The absorbent material contacts surface 27 of the radiation curable layer of the heated photosensitive element, and absorbs the liquefied portions 31 of the elastomeric polymer from the unirradiated portions of the composition layer 17, forming a flexographic printing plate in which portions 31 are removed as shown to form a relief pattern or surface. It is preferred that most of the composition in the uncured areas be removed from the flexible substrate 15 and be absorbed into the absorbent material. It is necessary to bring the photosensitive element 16 and fresh sheets of the absorbent material into contact several times to remove the liquefied, uncured elastomer. The term "melt" is used to describe the behavior of the unirradiated portions of the composition layer subjected to an elevated temperature that softens and reduces the viscosity to permit absorption by the absorbent material. The material of the meltable portion of the composition layer is usually a viscoelastic material which does not have a sharp transition between a solid and a liquid, so the process functions to absorb the heated composition layer at any temperature above some threshold for absorption in the absorbent material. A wide temperature range may be utilized to "melt" the composition layer for the purposes of this invention. Absorption may be slower at lower temperatures and faster at higher temperatures during successful operation of the process. Throughout the description, the term photosensitive element 11 refers to the state of the element where it has not yet been irradiated (exposed); photosensitive element 16 or photosensitive element sheet 16 or flexible sheet 16 or sheet 16 refers to the state of the element where it has been irradiated, but not yet developed fully to remove the unirradiated (uncured) portions; and photosensitive element 16a or flexible sheet 16a or sheet 16a or flexographic plate 16a or plate 16a refers to the state of the element where it has been fully developed by removing the unirradiated (uncured) portions to fully form a relief pattern, which in one embodiment is suitable for use as a flexographic printing plate.

Figure 2:
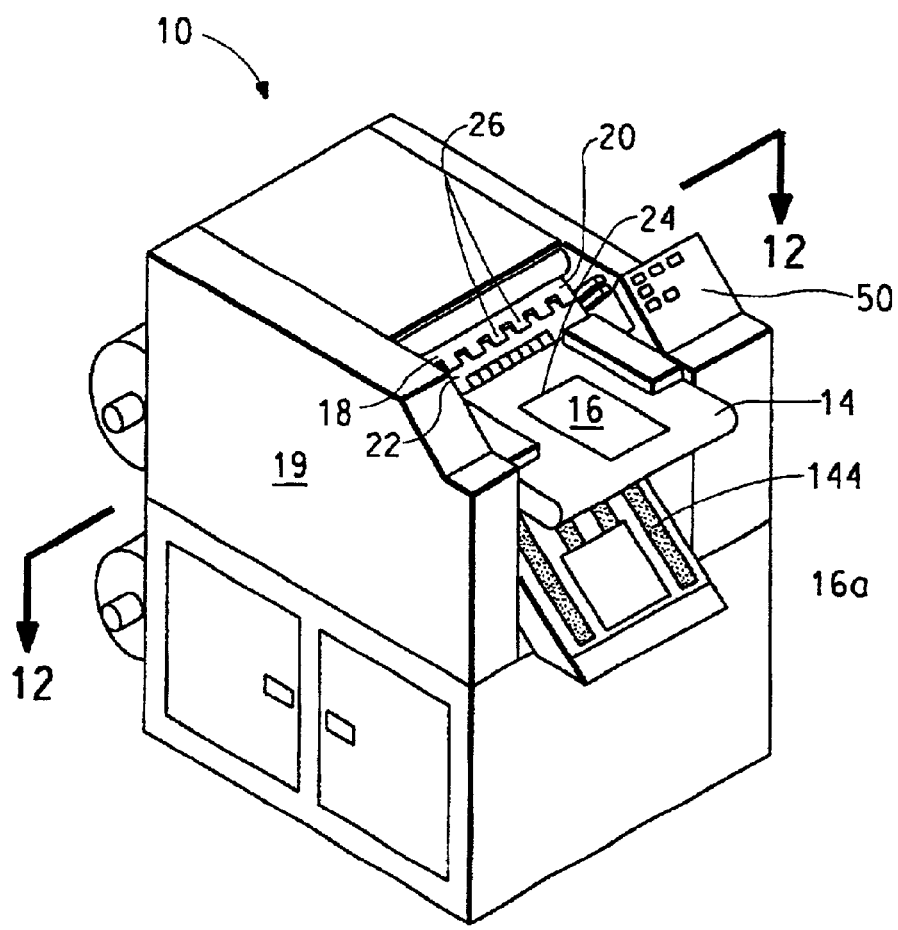
FIG. 2 is a perspective view of a first embodiment of the apparatus of the present invention.

FIG. 2 shows a first embodiment of an apparatus of the present invention as a plate processor 10. The plate processor 10 accepts the previously formed and previously imagewise actinic radiation exposed photosensitive element 16 which is in a sheet form sized to fit in the processor 10. The apparatus includes a support frame 12 (shown schematically in FIG. 6) and a feed tray 14 mounted onto the support frame 12, the feed tray 14 being of a size and a shape suitable for accepting a flexible photosensitive element sheet 16 for loading. After processing, a flexible sheet 16a is formed having a relief pattern. The flexible sheet 16a is received by a conveyor 144 beneath tray 14.

Figure 3:
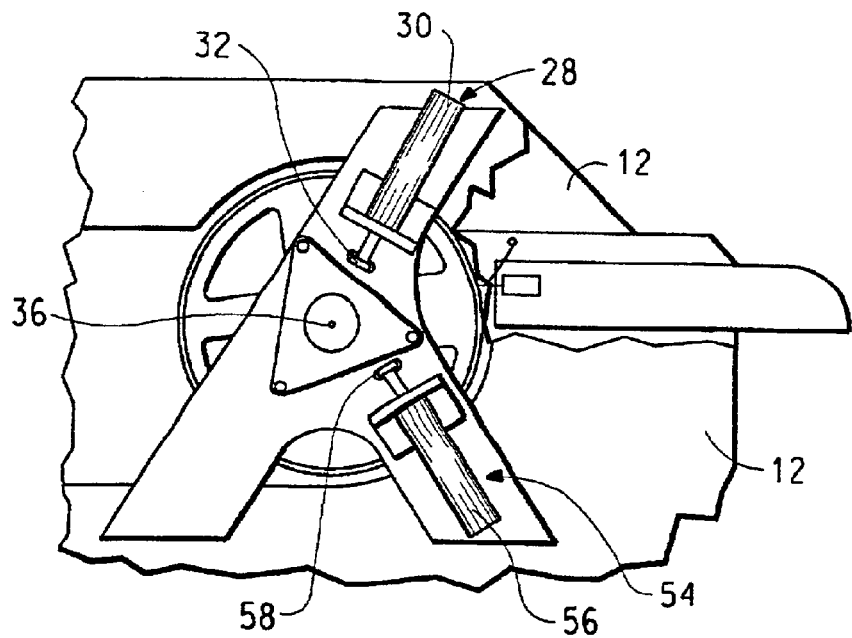
FIG. 3 is a detailed side elevational view of the actuators of the first embodiment.
Figure 4:
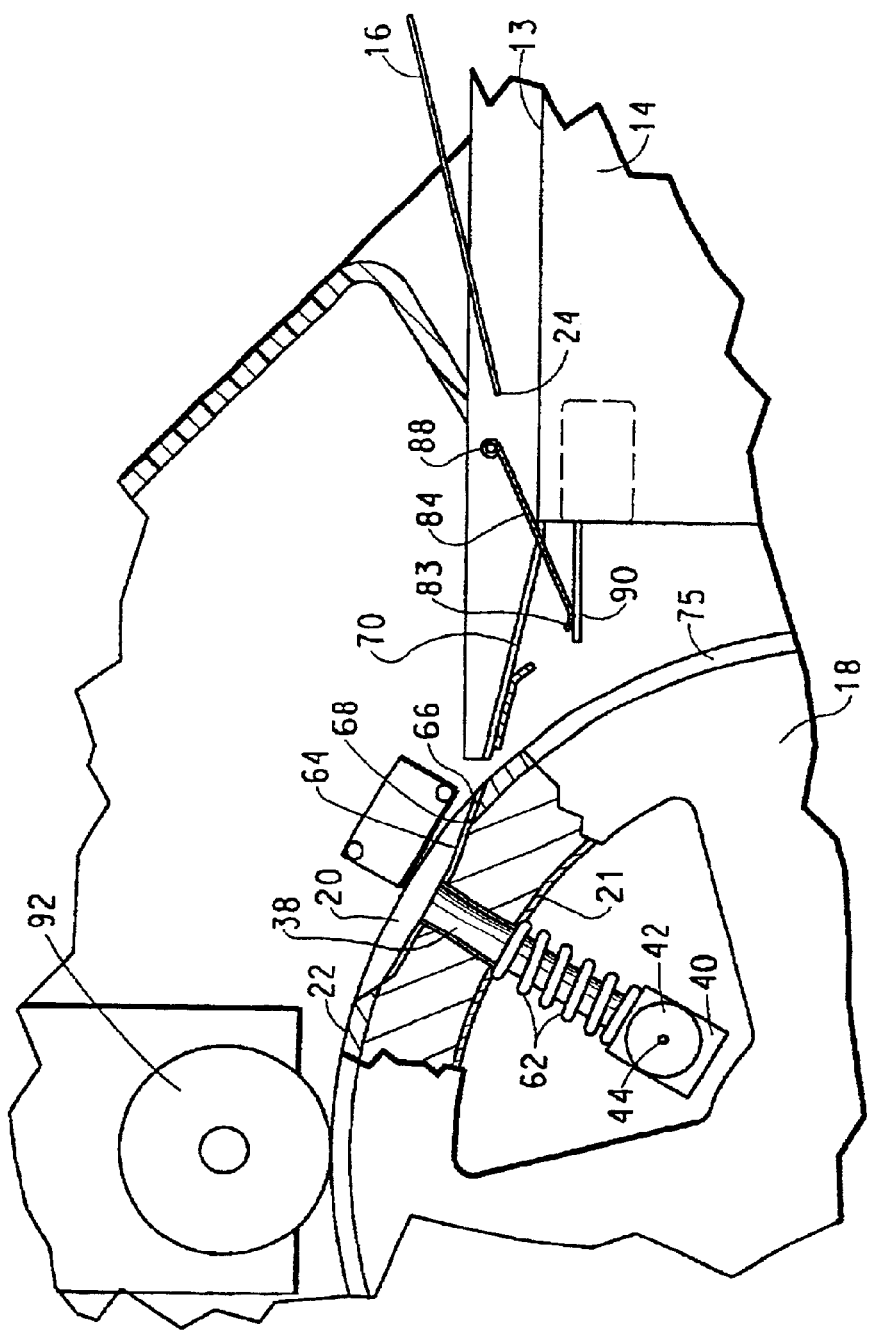
FIG. 4 is a detailed side cross-sectional view of the second delivery means.

The plate processor 10 of the present invention includes a drum 18, which in the illustrated embodiment rotates counter-clockwise from the first side 19 of the machine. The drum 18 acts as a delivery means for supporting and delivering the sheet 16 to other machine elements. The drum 18 has a flush mounted clamp 20 mounted transversely on the outer surface 22 of the drum for securing a leading edge 24 of the flexible sheet 16 to the outer surface 22 of the drum. The clamp 20 in one embodiment is elongated and has a plurality of teeth 26 extending tangentially in a direction opposite the direction of rotation of the drum. In operation, the clamp 20 is raised radially outward and off of the outer surface 22 of the drum 18 by an actuator means 28, shown in FIG. 3. In one embodiment, the actuator means 28 is a pair of pneumatic cylinders 30, mounted onto the frame 12, and positioned on opposite ends of the drum 18. The pneumatic cylinders are mounted radially at approximately a 30 degree angle from the vertical. The pneumatic cylinders 30 each have an end 32 (shown in FIG. 5) with a stop 34 which exerts a radial force away from the axis of rotation 36 (into the paper) of the drum 18. The operation of the actuation means 28 will be more clearly understood by first examining the features of the clamp 20 as shown in FIG. 4.

The clamp 20 is substantially elongated. In the preferred embodiment, the clamp 20 extends the fill width of the sheet 16. A plurality of support legs 38 is fixedly mounted onto a lower surface of the clamp 20, and extends through the drum wall and into the interior portion of the drum 18. The support legs 38 in one embodiment are cylindrical, and are fixedly connected to a transverse rod 40 which in one embodiment is formed from rectangular bar stock.

At each end of the transverse rod 40 is a cam follower 42 rotationally mounted along an axis 44 passing substantially through the center of the rod 40. The cam followers 42 in the preferred embodiment are substantially cylindrical. The length of the rod 40 without the cam followers 42 in the preferred embodiment is slightly shorter than the width of the drum 18, and the cam followers 42 extend outwardly of the sides of the drum 18.

Figure 5:
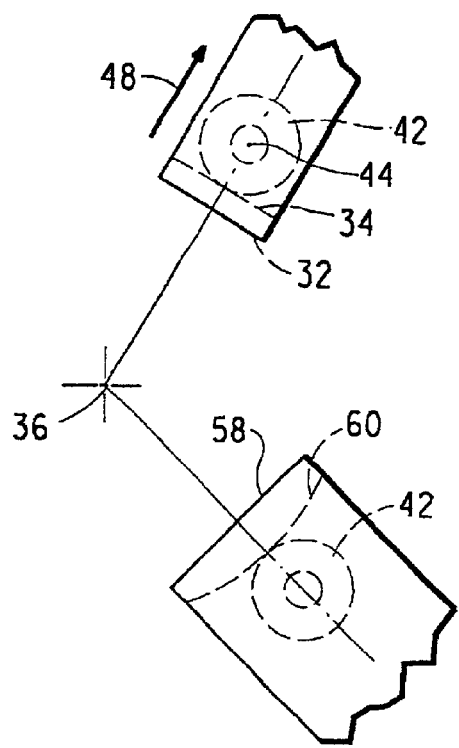
FIG. 5 is detailed drawing of the pneumatic cylinder ends.

A first end 32 as shown in FIG. 5 of pneumatic cylinder 30 retracts in a direction shown by arrow 48 in response to a signal from the controller (not shown). The controller (not shown) is programmable and operable from a control panel 50 (shown in FIG. 2). The control panel in one embodiment includes many features such as an on/off switch, a selector switch for selecting the number of cycles per sheet required, an open and close switch to operate clamp 20, a plurality of indicator lights for determining the cycle the machine is in and L.E.D. readouts to indicate operating temperatures, for example. The controller is preferably a programmable controller to readily permit changes in the operating parameters to be made.

Each first end 32 has a stop 34 that extends in a direction substantially parallel to a central cylinder axis 44 of the cam follower 42. The stop 34 engages the cam follower 42, and allows the pneumatic cylinder 30 (shown in FIG. 3) to lift the transverse rod 40 and clamp 20 upwardly (shown in FIG. 4), away from the central rotational axis 36 (as shown in FIG. 3) of the drum 18. The clamp 20 is opened by a manual switch when the drum 18 is at rest. The first embodiment also has a second pair of actuators 54 as shown in FIG. 3 which are also pneumatic cylinders 56, and are rigidly mounted onto the frame 12. The pneumatic cylinders 56 each have a first end 58 having a stop 60 (shown in FIG. 5) for receiving the same cam followers 42 at a different rotational location and when the drum 18 is in motion. The size and shape of the stops 60 are curved and larger than stops 34 because stops 60 engage the cam followers 42 during drum rotation, while stops 34 engage the same cam followers 42 when the drum is stationary. Referring back to FIG. 4, between the clamp 20 and the transverse rod 40 and fixedly attached to the clamp 20 and the rod 40 are support legs 38. Tensioning springs 62 extend around each support leg 38 and hold the clamp 20 substantially flush with the outer surface 22 of the drum when no other forces are being applied to the cam followers 42.

The clamp 20 must lift to a height sufficient to provide enough clearance for inserting the leading edge 24 of the flexible sheet 16 into an opening defined by a lower surface 64 of the clamp 20 and a clamp receiving surface 66 of the drum 18. The sheet 16 need only be positioned about 1.27 centimeters under the teeth 26 of clamp 20 to hold the sheet into place. The lower surface 64 of the clamp 20 has a downwardly projecting edge 68, which tightly grips the sheet 16 and holds the sheet 16 in place on the drum 18.

Upon activating the control panel 50 (shown in FIG. 2), the drum 18 should be in the "start" position. If not, the controller actuates the drum drive motor 73 (shown in FIG. 6) and advances the drum 18 to the "start" position (FIG. 4), where the clamp 20 is slightly above a front edge of a feed plate 70. A cam activated microswitch 71 (shown in FIG. 6) sends a signal to the controller to stop the drum when the drum 18 reaches the "start" position.

Feed plate 70 is inclined slightly to urge the leading edge 24 of the sheet 16 toward the clamp 20. A manual switch (not shown) is energized in the preferred embodiment to activate the clamp actuator 28 (shown in FIG. 3) which lifts clamp 20 upwardly and holds the clamp 20 in an "open" position. A second manual switch (not shown) is activated, closing the clamp. A third "start" switch (not shown) activates a control sequence. After the "start" switch is activated, the drive motor 73 (shown in FIG. 6) begins to rotate the drum 18. The drum 18 rotates at a preferred speed of about 76.2 linear centimeters per minute, as measured on the drum surface.

Figure 6:
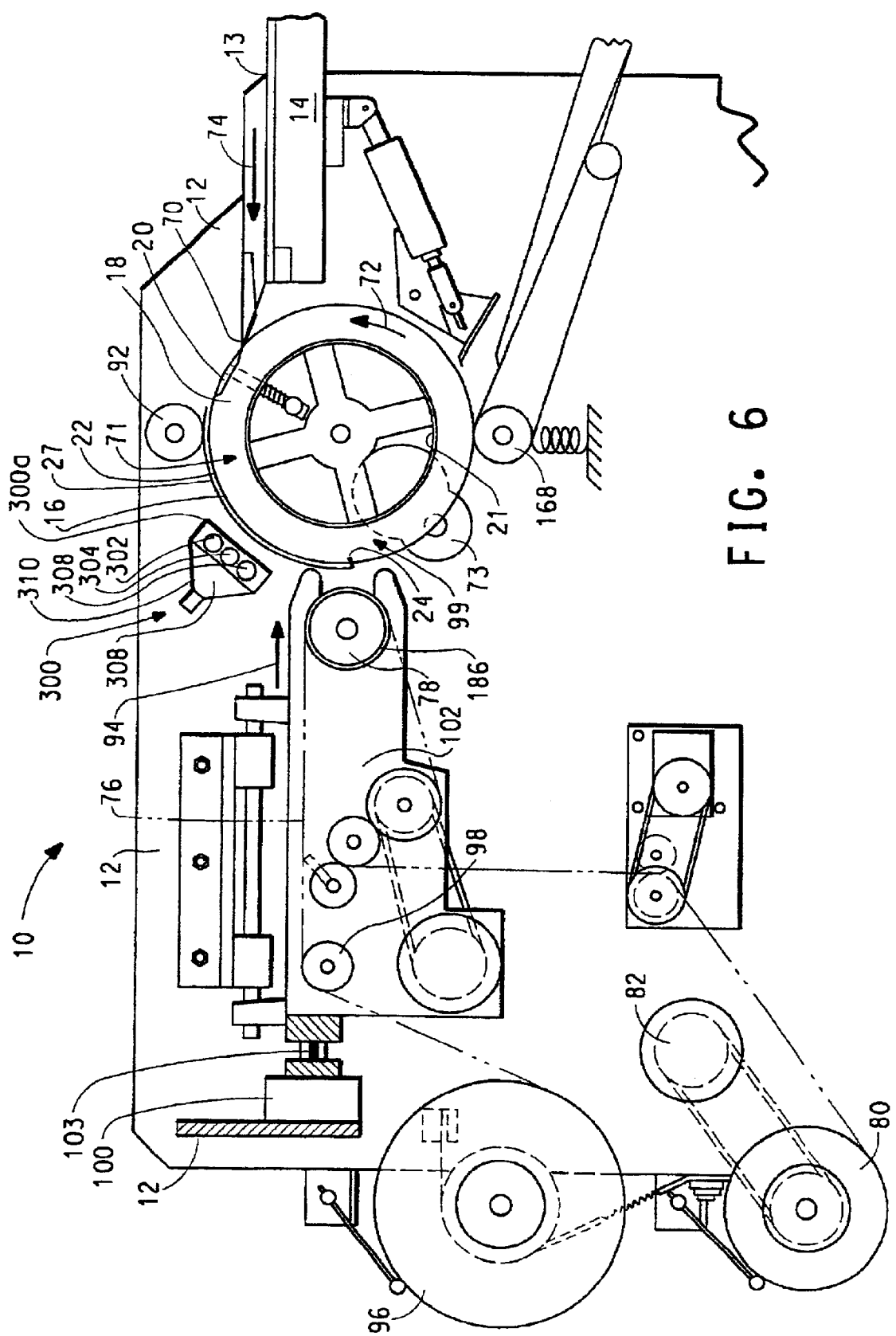
FIG. 6 is a side cross-sectional view partially in schematic of the first embodiment of the present invention.

The drum 18 in one embodiment is coated with a silicone rubber composition layer 75 having a Shore A hardness rating of about 55. The most preferred rubber coating is 3/16 inch thick silicone rubber and is impregnated with aluminum particles. This type of rubber coating is available from Robinson Rubber Products Company, Inc. of New Hope, Minn. It is believed that the aluminum particles improve the heat transfer characteristics of the drum by between 10 to 20 percent. The hardness of the coating layer 75 is important, although not critical to the invention. Flexible coatings having a Shore hardness between about 30 and about 60 are suitable for covering the drum 18 of the present invention. The resilient surface provided by the rubber can result in a longer nip zone as a result of the surface deflecting under the pressure exerted by a hot roller 78 (FIG. 6). The rubber elasticity also accommodates some minor misalignment between the drum and hot roll. In another embodiment, the drum has a smooth metallic surface covered with a thin tackification coating to help the sheet adhere to the drum. Such a coating is DOW 236 from Dow Corning. This thin coating provides improved thermal conductivity between the photosensitive element and the drum. In this case, other means for accommodating minor misalignment between the drum and hot roll should be provided.

FIG. 6 shows a side section through the first embodiment of the present invention. The drum 18 is mounted for rotation on a stationary support frame 12 and rotates in a counterclockwise direction as indicated by arrow 72. A photosensitive element sheet 16 (shown in FIG. 2) is placed on a surface 13 of feed tray 14 and is urged in a direction indicated by arrow 74. The leading edge of a flexible sheet 16 is inserted into clamp 20. The sheet 16 remains substantially in contact with the surface 22 of the drum during processing. Located adjacent the drum 18 is a first heating means comprising a heater 300 which, in the embodiment illustrated, is a focussed radiant heater directed at the exterior surface 27 of the composition layer of the photosensitive element 16 on the drum 18. The heater 300 elevates the temperature of the exterior surface 27 to a temperature T1 which is equal to or greater than a temperature T2 sufficient to melt the unirradiated portion of the composition layer, causing a portion of the layer to liquefy. The heater 300 is a type of heater that does not directly heat the flexible substrate 15 coated with the composition layer 17. The heater applies heat from the exterior surface side 27 of the composition layer 17, rather than the exterior surface side 23 of the flexible substrate 15 or from both surfaces 27 and 23. This allows the exterior surface 23 of the flexible substrate 15 to be maintained at a temperature T3 at least 20° F. below temperature T1 during thermal processing of a sheet 16. In the embodiment illustrated, the heater 300 comprises a plurality of tubular infrared heating bulbs, such as bulbs 302, 304 and 306 mounted in end supports, such as support 308 connected to frame 12, that also provide electrical connections to the bulbs. Adjacent the side of the bulbs opposite drum 18 is a reflector 310 that acts to focus and direct the infrared radiation toward the exterior surface 27 of the composition layer 17 of the photosensitive element sheet 16 on the drum 18. A line passing through the center of the heater (bulbs and reflector) would lie on a radial line through the drum in this embodiment. Such a heater comprising a plurality of infrared heating bulbs mounted in end supports with a reflector can be obtained from Therm Coil/Aitken Products, model EXT-4502 located in West Newton, Pa. 15089.

The plate processor 10 of the present invention includes a delivery means for feeding a continuous web 76 of nonwoven material, which in the preferred embodiment contacts a hot roller 78. The hot roller 78 is positioned adjacent the heater 300, and the roller 78 maintains or further elevates the temperature of the exterior surface 27 of the composition layer to temperature T4, which may be at or exceeding the melt temperature T2 sufficient to melt the unirradiated portion of the composition layer to cause a portion of the layer to liquefy. The hot roller 78 applies heat from the exterior surface side 27 of the composition layer 17, which allows the exterior surface 23 of the flexible substrate 15 to be maintained at the temperature T3 which is also at least 20° F. below temperature T4. The heating to temperature T1 and the heating to temperature T4 must both individually and cumulatively be such as to maintain the flexible substrate 15 below temperature T3 that would distort flexible substrate 15. It is believed that a shrinkage distortion of the substrate of more than 0.02%–0.10% at the development temperature T3 is enough to cause problems in the end use. This distortion can come about when there is a mismatch between the shrinkage characteristics of the substrate and the temperature the composition layer must be raised to in the process. A substrate with a high shrinkage at the developing temperature of the composition layer must be maintained at a temperature much less than the developing temperature of the composition layer during the heating process. The heating means of the present invention provides the ability to achieve such a temperature difference between the composition layer and the substrate to control substrate distortion. If the substrate can tolerate a temperature close to the composition layer temperature without undue distortion, the temperature difference achieved by the heating means of the invention may not need to be as great. In general, however, it is believed beneficial to keep the substrate temperature lower than the temperature of the composition layer.

Due to thermal inertia of the materials making up the photosensitive element, the non-steady state temperature T3 may be reached at different times than the non-steady state temperatures T1 and T4. The heated web transfers heat to the flexible photosensitive element sheet 16, melts a portion of the composition layer and absorbs at least a portion of the liquefied polymer. The combination of the heater 300 and hot roller 78 rapidly heats the composition layer 17 for such a thickness that a substantial portion of the uncured composition layer is absorbed by the absorbent layer and removed from the photosensitive element 16. In the first embodiment of the present invention, a take-up roll 80 is provided for winding the nonwoven material 76 after processing. In one embodiment, the take-up roll 80 is independently belt driven by a variable speed motor 82.

The drum 18 in one embodiment is equipped with a heater, which is provided to keep the photosensitive element 16 at a stable starting temperature independent of the surrounding environment. It would be set to keep the temperature slightly above the highest ambient temperature expected where the apparatus would be operated. The heater illustrated is an electrical heating blanket 21, available from the Watlow Electric Company of St. Louis, Mo. In one embodiment, the heating blanket is a wire wound blanket, having a 0.1143 cm. thickness, a 45.72 cm. width, and a 60.96 cm. length. The heating blanket has a 2000 watt capacity and uses a 220 volt energy supply. Any means of heating the drum is acceptable, as long as the power capacity of the heater is sufficient to maintain a fairly constant selected skin temperature on the outer surface of the drum 18 of about 75–90° F. If the normal operating environment is carefully controlled to be a constant temperature, the heater 21 can be turned off or omitted from the apparatus. The heater 21 would always be operated in a way to keep the temperature of the exterior surface 23 of the flexible substrate maintained at a temperature T3 at least 20 F below temperatures T1 and T4 during thermal processing of the photosensitive element 16.

Although the specific type of absorbent material is not critical to the present invention, the most preferred nonwoven material is Cerex TM, a nylon random web nonwoven material manufactured by the Cerex Advanced Fabrics of Pensacola, Fla. The selection of the web material 76 depends in large part upon the thickness of meltable portion of the flexible sheet 16 to be processed, the melting temperature of the meltable portion, the heat transfer characteristics of both the flexible sheet 16, and the nonwoven material 76, and the strength of the nonwoven absorbent material during the separation of the material from the sheet 16.

The drum 18 as shown in FIG. 6 of the first embodiment has an outer diameter of approximately 25.88 centimeters and a width across the drum of about 48.26 centimeters. The drum 18 in one embodiment is of a size sufficient to process a photosensitive element sheet 16 having up to a 71.12 centimeter length as measured in the direction of travel of the sheet. Also, for a drum width of 48.26 centimeters, the maximum width of a sheet 16 to be processed would be about 35.56 centimeters. The total composite sheet thickness processed can be between about 0.48 mm and about 1.83 mm. Any size flexible sheet 16 that is smaller than the stated maximum dimensions could be processed on the plate processor 10.

A controller (not shown) is provided and is programmable by a control panel 50 (shown in FIG. 2). When the machine is turned on, the drum 18 is in the "start" position. In the "start" position, a trailing edge of the clamp 20 is in close proximity with the feed plate 70, shown in detail in FIG. 4. A guide plate 84 is pivotally mounted above the feed surface 13. As the trailing edge of the flexible sheet 16 passes the leading edge 83 of guide plate 84, the guide plate pivots downwardly along pivotal axis 88 (into the paper) and engages a switch 90 generating a signal which is sent to and processed by the controller (not shown) to compute a "length" for the sheet. The controller uses this value at the end of the processing cycle to determine when to turn off or reduce power to heater 300 and when to disengage the absorbent web 76 from the flexible sheet 16.

Clamp 20 holds the leading edge of the flexible sheet 16 onto an outer surface of the drum 18 while the drum is rotating. A steady roller 92 is provided to hold the sheet 16 onto the drum surface 22 during rotation. Steady roller 92 is positioned at approximately the uppermost location on the drum 18 in one embodiment to eliminate air between the sheet 16 and the outer surface 22 so the sheet is substantially continuously contacted and supported by the surface 22 of the drum 18. One typical rotation speed is about 76.2 linear centimeters per minute (30 inches per minute) at the drum surface 22. From the previous discussion, it would be possible to run the machine faster by increasing the operating temperature of the radiant heater 300 and hot roller 78. It would also be possible to operate the machine slower at lower temperatures. A problem with operating the machine faster is that less meltable composition has time to absorb into the web, so more passes may be required. More passes may defeat the advantage of running at a faster speed and more passes consume more absorbent web material. A problem with running at a very slow speed is that too much meltable composition may be absorbed by the web in one pass and it may be squeezed out as the web passes over machine guide rolls, thereby fouling the rolls. Determining an optimum running speed requires a balance between many factors.

Referring back to FIG. 6, in order to raise the outer surface temperature of the flexible sheet 16 to a temperature which exceeds the melt temperature of the unirradiated, uncured portion of the radiation curable composition layer 17 while maintaining the flexible substrate 15 at a temperature at least 20° F. lower, the heater 300 is energized before the leading edge of the photosensitive element sheet 16 reaches the heater 300, and the hot roller 78 is moved in the direction shown by arrow 94 until its outer surface contacts the leading edge 24 of the flexible sheet 16. The hot roller 78 in the first embodiment is driven by friction between its outer surface and the absorbent web 76 contacting the roller 78. It is important that the linear speed of the hot roller 78, the web 76, and the sheet 16 be substantially the same to avoid any shear stress on the sheet. Such stress is known to cause uneven relief portion plate thickness and a distorted image, which is undesirable. The hot roller 78 rotates in a direction opposite the direction of rotation 72 of the drum 18.

The web 76 originates from a supply roll 96 of absorbent material, which is mounted for rotation onto the stationary support frame 12. The web 76 of absorbent material passes over a first idler roller 98, which is positioned to deliver the web substantially horizontally to the hot roller 78. The absorbent material comes into face-to-face contact with the hot roller 78, which in one embodiment may be operated. Although the operating temperature of the hot roller is about 234° C., it is known at the upper limit is determined in large part by the melting temperature of the web 76 which in one embodiment is about 245° C. (473° F.). Another temperature limitation is the melt temperature of the substrate 15. The substrate 15 of one preferred embodiment is a polyester film having a melt temperature of about 220° C. (428° F.). Because the heat transfer is not at a steady state, hot roller 78 temperature of up to 245° C. does not melt the flexible film substrate 15. The hot roller 78 temperature must also be low enough so that when the web 76 is not moving and the portions of the web contacting the hot roller 78 are at rest, the web 76 does not melt. The hot roll temperature must also be low enough that the flexible substrate 15 does not experience a distortion temperature that produces a distortion in any direction of greater than 0.02% to 0.1% during the development process. Heat is provided to the hot roller 78 by a core heater available from Watlow Electric Company of St. Louis, Mo. A cartridge heater having a 0.952 centimeter diameter, a 55.88 centimeter length and having 1450 watts power using a 220 volt supply would provide sufficient energy to maintain a skin temperature of approximately 234° C. Although the hot roller 78 of the first embodiment includes an electrical core heater, the present invention contemplates the use of steam, oils hot air, and a variety of other heating sources to provide a skin temperature sufficient to melt a portion of the composition layer through the web. The hot roller 78 is preferably metal having an outer surface that may be coated with a layer of elastomer coating 186. Although it is believed that a wide range of Shore A hardness units between about 30 and about 90 would be suitable to coat the hot roller 78, the most preferred rubber has a Shore A hardness of approximately 50 units. In the preferred embodiment, the rubber coating 186 is approximately 3/16 inch (4.76 mm) thick silicone rubber. In some cases, the hot roll is aluminum and may have an aluminum outer surface with an anodized finish without any elastomer coating.

The controller (not shown), after measuring the length of the flexible sheet 16, and after receiving a signal from a cam operated microswitch 99 indicating that the leading edge 24 is at a point nearest the hot roller 78, actuates a pneumatic cylinder 100 which is fixedly mounted onto the stationary frame 12. The cylinder 100 extends, causing a movable frame 102 supporting the idler roller 98 and the hot roller 78 to move in a direction designated by arrow 94. In one embodiment, tensioning springs 103 are provided between cylinder 100 and frame 102 to urge hot roller 78 against the sheet 16 at a selected pressure after the cylinder 100 has delivered the hot roller 78 to the "engaged" position.

FIG. 8 shows the device 10 with the hot roller 78 engaged. The nip 104, or distance between the hot roller 78 and the drum 18, when the hot roller 78 is in the engaged position for this preferred embodiment, is zero centimeters. It is desirable to set the distance such that a substantially uniform pressure of between about 2.11 kilograms per square centimeter and about 4.92 kilograms per square centimeter, with a preferred pressure of about 3.16 kilograms per square centimeter is applied to the nip area of the exterior surface 27 of the flexible sheet 16 during processing. Pressure is applied to force the absorbent web into intimate contact with the sheet 16. It is believed that between about 0.70 kilograms per square centimeter and about 7.03 kilograms per square centimeter in the nip area is adequate to enhance the absorption from the sheet surface to the absorbent web without distorting the composite photosensitive element. FIG. 7 shows a pressure limiting device 101 mounted onto a rotational shaft of the hot roller 78. The device 101 rides on an outer edge of drum 18 and limits the pressure exerted on the sheet 16.

As the web 76 passes over the hot roller 78, its temperature is rapidly elevated to a temperature that must exceed the melt temperature of the polymer coating on the flexible sheet 16. The cylinder 100 in FIG. 8 is in the extended position, with the hot roller 78 urged against the drum 18 and in intimate contact with both the web 76 and the exterior surface 27 of the sheet 16. As the sheet 16 passes through the nip 104, a portion of the polymer coating liquefies and is absorbed into the web 76. Typically, a single pass (one cycle) across hot roller 78 is insufficient to remove the full depth of relief of uncured material. For this reason, the controller (not shown) is programmed to allow the drum to rotate a total of several complete revolutions such that substantially all of the molten polymer can be absorbed onto the web 76. For some conditions of photosensitive element, heater power, hot roll temperature, and drum speed, as many as 12–15 cycles may be used to remove the desired amount of the uncured portion of the composition layer.

Although one preferred embodiment requires nine passes to remove all the molten polymer, it is to be understood that by selecting a different and more absorbent material with more favorable heat transfer characteristics, and by varying other parameters such as the thickness of the layer to be removed, it would be possible to achieve the desired absorption in fewer than nine passes. Similarly, with other configurations, it would be necessary to pass the flexible sheet past heater 300 and hot roller 78 more than nine times.

After absorption, web 76 passes over a drive roller 106, which in the preferred embodiment is belt driven by a motor 108. In one embodiment, motor 108 is a variable speed motor. The motor is of a size, which will pull the web 76 through the device 10 at a linear speed that is synchronized with a linear speed of the outer surfaces of the sheet 16 on the drum 18, and the hot roller 78.

The drive roller 106 in the first preferred embodiment has an abrasive outer surface. The roller 106 is preferably coated with an abrasive material such as sandpaper. The abrasive coating improves the frictional forces between the roller 106 and the web 76 and prevents slippage. The web 76 contacts at least one-third of the outer surface of the drive roller 106 in one embodiment and loops over an idler roller 110 which aids in providing a substantially uniform tension to the web throughout the device 10. In addition to the idler roller 110, a brake 112 is provided which prevents the supply roll from unrolling too rapidly, for example, before the drive roller 106 pulls the web through.

A second idler roller 114 is optionally provided to further maintain tension on the web 76. After the web 76 exits from between rollers 110 and 114, the web 76 is directed through another pair of guide rollers 116 and 118 and is collected on a take-up roller 80.

Take-up roller 80 in one embodiment is belt driven by a variable speed motor 122. This motor speed must be adjusted so as to not interfere with the selected web tension. If the motor interferes with web tension, the final formed flexible sheet 16a with the relief pattern formed in this manner could potentially have variable heights in the relief portions or might warp, for example, and be commercially unacceptable as a flexographic printing plate.

According to another embodiment, a diameter sensor 124 is mounted onto the stationary frame 12 and measures the outer diameter of the absorbent material wound onto take-up roll 80. As the sensor 124 pivots, the output voltage from the sensor varies. In still another embodiment, a magnetic particle clutch (not shown) is mounted onto a rotating shaft supporting the take up roll 80, and the varying output voltage from sensor 124 varies the torque applied to the shaft to limit the rate of takeup. This clutch feature maintains substantially uniform tension on the portion of the web 76 near the take-up roll 80.

In another embodiment, the supply roll 96 is also equipped with a diameter sensor 126, which works in a substantially identical manner to sensor 124. The sensor 126 sends a signal to a magnetic particle brake (not shown) mounted onto a rotating shaft supporting the supply roll 96. The varying voltage varies the torque applied to the shaft supporting the supply roll 96, and maintains constant tension on the web 76. The magnetic particle brake is an example of an alternative device to replace the brake 112 to limit the unwinding of supply roll 96. The idler roller 110/drive roller 106 arrangement and magnetic particle brake delivers a web 76 having a uniform tension applied and that travels at a substantially constant rate of speed. In contrast, the brake 112 only roughly maintains tension in the web.

Figures 9, 10:
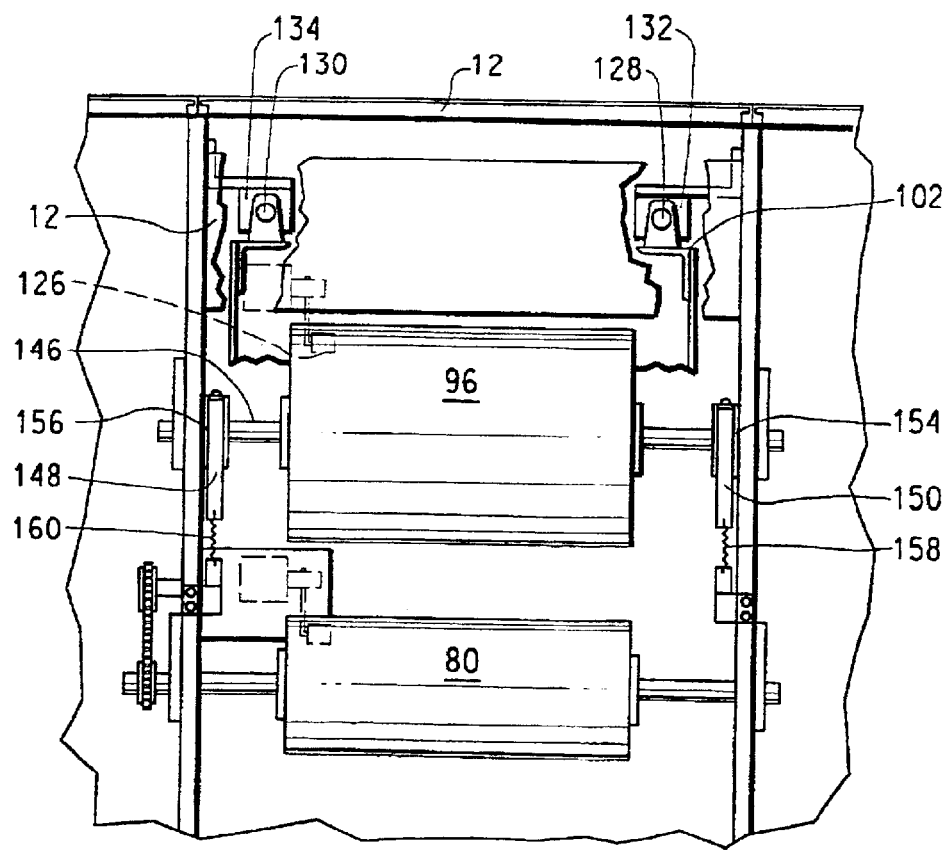
FIG. 9 is an end elevational view, partially cut out of the first embodiment of the present invention.
FIG. 10 is a side elevational view of the drum.

In the first embodiment, the guide roller 98, hot roller 78, drive roller 106, drive motor 108 and idler rollers 98 and 114 are all mounted onto a movable support structure (or moveable frame) 102 actuated by a pneumatic cylinder 100. The movable support structure 102 shown in FIGS. 8 and 9 is suspended from two spaced apart rods 128 and 130 which slide horizontally through a pair of support brackets 132 and 134 toward the drum 18. Support brackets 132 and 134 in the first embodiment are secured to the stationary frame 12. In operation, when the pneumatic cylinder 100 shown in FIG. 8 is actuated, the entire movable support structure 102 slides along spaced apart rods 128 and 130 until hot roller 78 contacts drum 18. This position is referred to as the "running position" of hot roller 78.

The control means (not shown) in the first embodiment causes the heater 300 to turn on before the leading edge 24 of the photosensitive element sheet 16 reaches the edge 300a of the heater. The control means also causes the assembly on the support structure 102 to move into the running position as soon as a leading edge 24 (shown in FIG. 6) of the flexible sheet 16 reaches the nip 104. The hot roller 78 raises the temperature of the web 76 in one embodiment to about 234° C. At this temperature, the uncured portions of the upper layer of the flexible sheet 16 in contact with the heated web liquefy. Due to the heat transfer characteristics of the composite flexible sheet 16, it is necessary to separate the web 76 from the flexible sheet 16 immediately after absorption. This is accomplished by pulling web 76 away from the surface of the flexible sheet 16, in a direction of about 90 degrees from the direction of travel of the sheet 16, shown as angle 135. It is believed that pulling the absorbent material away at an angle of at least 45 degrees is necessary to release the sheet from the web before the liquefied polymer cools and resolidifies. The preferred range of angles is between 75 and 105 degrees, and the most preferred angle is about 90 degrees. After the point of absorption at the nip 104, the flexible sheet 16 may sag slightly and separate briefly from the drum 18. By pulling the web 76 at an angle slightly below the horizontal, the flexible sheet 16 and web 76 rapidly separate. When the trailing edge of the flexible sheet 16 passes out of the range of the heater 300, the controller may turn off or reduce power to the heater 300 depending on the sheet length and heater characteristics. When the trailing edge of the flexible sheet 16 passes out of nip 104, the controller (not shown) moves the hot roller 78 away from the drum 18, stops the drive motor 108, and rapidly advances the photosensitive element sheet 16 again so that the leading edge is returned to heater 300 and nip 104. This "rapid advance" feature causes the drum 18 to rotate at 3 to 4 times the normal speed to save time, and improve machine capacity. This rapid advance is only employed when the sheet length is short relative to the circumference of the drum so there is a significant distance between the trailing and leading ends of the sheet on the drum.

The brake 112 stops the travel of the web 76 while the drum 18 is advancing to begin a new cycle. The brake 112 eliminates wasting unused web material 76. The device in one typical embodiment performs the absorption step nine times on each sheet 16. At the conclusion of the ninth cycle, and as soon as a trailing edge of the photosensitive element passes through the nip 104, the controller initiates a timing sequence utilizing the length measurement performed earlier to locate the trailing edge of the sheet 16. As soon as the trailing edge of the sheet leaves the heater 300 and nip 104, the controller turns off power to the heater and moves the hot roller 78 away from the drum, and stops the drive motor 108. As the drum 18 continues to rotate, cam operated microswitch 109 engages a cam on the drum 18 generating a signal received by the controller. The controller actuates clamp actuator 54 (shown in FIG. 3) which releases a leading edge of the flexible sheet now a fully formed flexographic plate 16a.

The leading edge of the flexible plate 16a is also assisted in being released from the drum by a stripper 136 which includes a pneumatic cylinder 138 pivotally mounted at one end to a lower surface of the feed tray 14. At the opposite end of the cylinder 138 is pivotally mounted a stripper blade 140 which in the preferred embodiment extends transversely across the width of drum 18. The most preferred stripper blade 140 has a plurality of fingers that extend to an outer surface of the drum 18 and mesh with the teeth 26 of clamp 20 (shown in FIG. 2). The controller (not shown) at the conclusion of the last cycle, extends the stripper blade 140 until the blade contacts the outer surface of drum 18. The leading edge of the formed flexographic plate is gently lifted off the outer surface of the drum 18, and the plate moves in the direction shown by arrow 142. In the most preferred embodiment, conveyor 144 removes each formed flexographic plate 16a from the device 10. Idler roller 168, which in the first embodiment is part of the conveyor 144, is positioned between the hot roller 78 and the stripper 136. Engagement of this roller 168 with the drum 18 drives the plate 16a after the clamp 20 releases the leading edge.

Referring back to FIG. 9, a supply roll 96 of absorbent web material 76 is mounted onto a shaft 146 equipped with tensioning means which in one embodiment are brakes 148 and 150. Brakes 148 and 150 are formed from flexible straps, each strap fixedly mounted at a first end 152 (shown in FIG. 8). The straps wrap around sheaves, 154 and 156, which in one embodiment have substantially smooth outer cylindrical surfaces. The sheaves 154 and 156 are fixedly mounted onto the supply roll shaft 146. The brakes 148, 150 according to the one embodiment include flexible leather straps. The straps have first ends which are fixedly mounted 152 onto stationary support frame 12 and have opposite ends equipped with tensioning springs 158 and 160 which are fixedly mounted onto the stationary frame 12.

In operation, brakes 148 and 150 provide tension on the web 76 as the web 76 is pulled through by the drive roller 106. The tension varies slightly as the diameter of supply roll 96 varies. In another embodiment, a sensor 126 is provided for detecting the outside diameter of the supply roll 96. The sensor 126 is a potentiometer having a voltage, which varies with pivotal position. The voltage output is sent to a magnetic particle brake (not shown) mounted onto shaft 146 which varies the torque output of the shaft 146. The magnetic particle brake and sensor 126 together maintain a substantially constant tension on the web 76.

Figure 11:
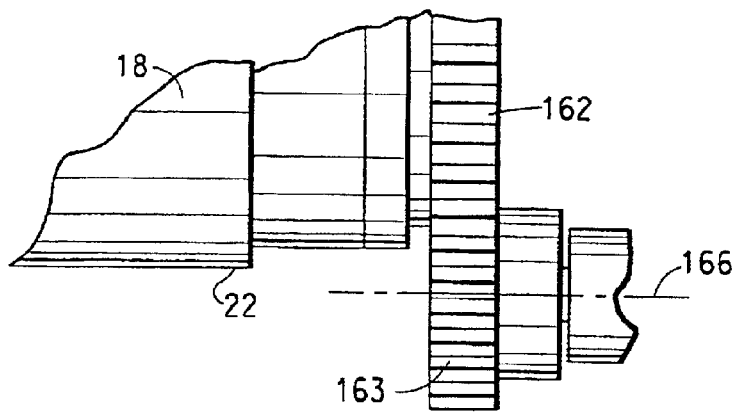
FIG. 11 is a more detailed view of the gear and pinion.

FIG. 10 shows the drum 18 of a preferred embodiment of the present invention. An important aspect of the present invention is to design the motion of the drum 18 to achieve the smoothest possible rotation and to prevent backlash. A gear 162 is mounted onto a first end 164 of the drum 18 and meshes with a pinion 163 at a point very near the outer surface 22 of the drum 18. In the first embodiment, a brake consisting of an electrical circuit to reverse the direction of current supplied to the motor 73 is provided to stop the rotation of the drum 18. This method of braking is commonly referred to as electro-dynamic braking. Referring to FIG. 11, a central axis 166 of the pinion 163 shaft is closely spaced to the outer surface 22 of the drum 18, such that the gear 162 and pinion 163 mesh at a point proximate the outer surface 22.

The idler roller 92 shown in FIG. 10 in one embodiment exerts minimal pressure, for example only its own weight, on the flexible sheet. Idler roller 92 forces entrained air out from beneath flexible sheet 16, and improves heat transfer between the flexible sheet 16 and the drum 18. Second idler roller 168 is spaced about 180 degrees from idler roller 92 and also serves the purpose of driving the flexible sheet 16 after clamp 20 has released the leading edge. Idler roller 168 is also a part of a conveyor 144 (shown in FIG. 8) for moving the formed plates from the device 10. In one embodiment, roller 168 is spring loaded against drum 18.

Although the control scheme of the most preferred embodiment employs the use of cam operated switches and timers to control the device 10, FIG. 10 shows an alternative device for controlling the operation of the present invention. In this embodiment, an encoder 170 is provided for generating a series of pulses to send to a number of counters. The counters are employed using known means to control the device 10. An alternative to the encoder 170 is a sensor (not shown) that counts the gear teeth on the gear 162 attached to the drum 18 to generate the necessary pulses for control of the device 10.

Figure 12:
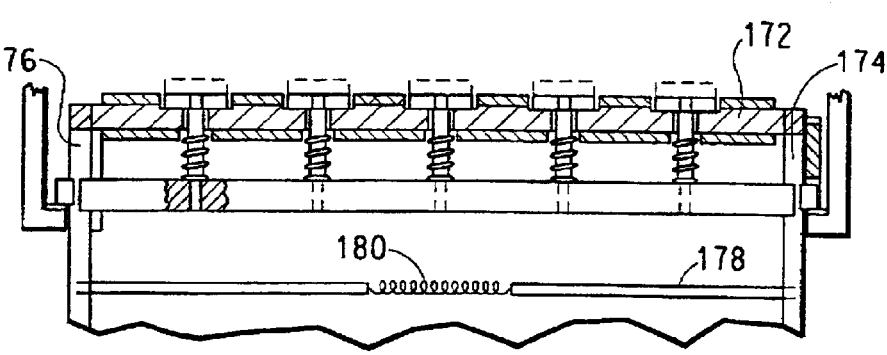
FIG. 12 is a side cross-sectional view of the drum taken along line 12-12 as shown in FIG. 2.

FIG. 12 shows another aspect of the design of the drum 18 in one embodiment. The drum 18 is constructed to avoid thermal stresses that could warp the surface of the drum and produce an unacceptable flexographic plate. The drum 18 has a main wall portion 172. Mounted onto each end of the substantially cylindrical main wall portion 172 are hubs 174 and 176 which are held in place by four spaced apart tie-rods 178 extending through both hubs 174 and 176. Proximate the center of each tie-rod 178 is a tensioning spring 180 that has the function of holding the hubs 174 and 176 against the main wall portion 172 and at the same time allows the main wall portion 172 to freely expand in a direction substantially parallel to the axis of rotation.

Figure 13:
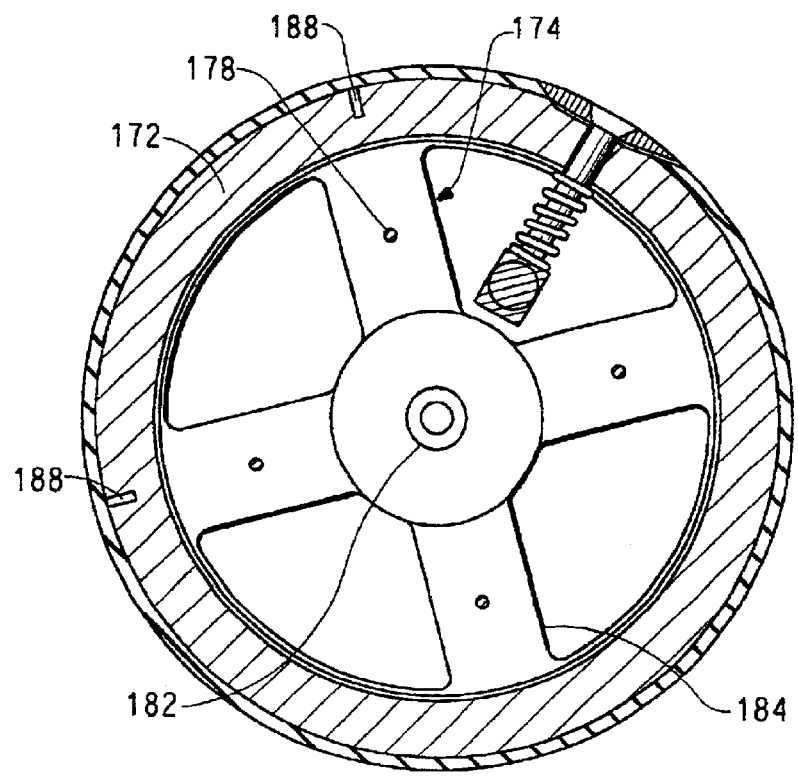
FIG. 13 is a side elevational view of the hub of the drum.

FIG. 13 shows one hub configuration is shown in. Each hub 174, 176 is mounted onto a central stub shaft 182. In one embodiment, one stub shaft 182 is hollow. The tie rods 178 are mounted onto arms 184, each being spaced apart by about 90 degrees. The design of the drum 18 not only provides for expansion in the direction parallel to the axis of shaft 182 but it also allows for expansion in all directions.

Hubs 174 and 176 are also equipped with four slots 188 which in one embodiment are spaced apart at approximately 90 degrees from each other for accepting keys (not shown) from the main wall section 172 of the drum 18. The slots 188 and keys (not shown) together assure that the main wall section 172 remains concentric with respect to the axis of rotation of the drum 18 and prevent relative rotational movement between the hubs 174 and 176 and the main wall portion 172.

Figure 14:
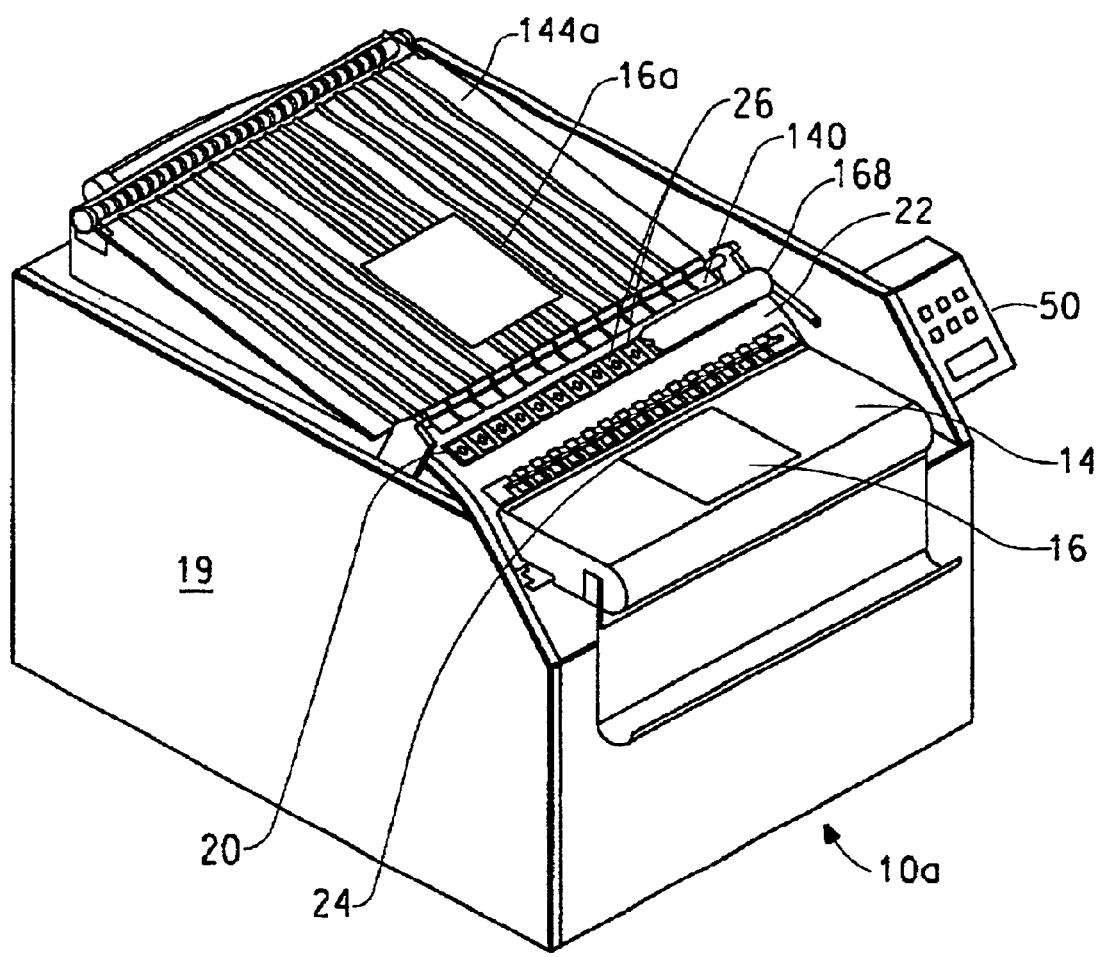
FIG. 14 is a perspective view of a second embodiment of the present invention.

FIG. 14 shows a second embodiment of the plate processor 10a for heat developing a photosensitive element 16. It is similar to the processor 10 illustrated in FIG. 2 and similar items are numbered the same. In the case of FIG. 14, the machine covers are removed for clarity. The second embodiment of the present invention shown in FIG. 14 includes a support frame 12 (shown schematically in FIG. 15) and a feed tray 14 mounted onto the support frame 12, the feed tray 14 being of a size and a shape suitable for accepting a flexible sheet 16 for loading. The plate processor 10a includes a drum 18 which in the illuated embodiment rotates counter-clockwise from the first side 19 of the machine. The drum 18 acts as a delivery means for supporting and delivering the sheet of film to other machine elements. The drum 18 has a flush mounted clamp 20 mounted transversely on the outer surface 22 of the drum for securing a leading edge 24 of the flexible sheet 16 to the outer surface 22 of the drum. The clamp 20 in one embodiment is elongated and has a plurality of teeth 26 extending tangentially in a direction opposite the direction of rotation of the drum. When processing is complete after the last sheet cycle, the flexible sheet or plate 16a, now with a fully formed relief pattern, is received by a conveyor 144a located above the tray 14 which is a detail different from the first embodiment 10 in FIG. 2 in which the conveyor 144 is located below the feed tray 14. A stripper blade 140 has a plurality of fingers that extend to an outer surface of the drum 18 and mesh with the teeth 26 of clamp 20. Idler roller 168 is positioned adjacent the stripper blade 140. This roller 168, when contacting the drum 18, drives the sheet 16 after the clamp 20 releases the leading edge at the conclusion of the last cycle for the sheet. A controller (not shown) is provided and is programmable by a control panel 50.

Figure 15:
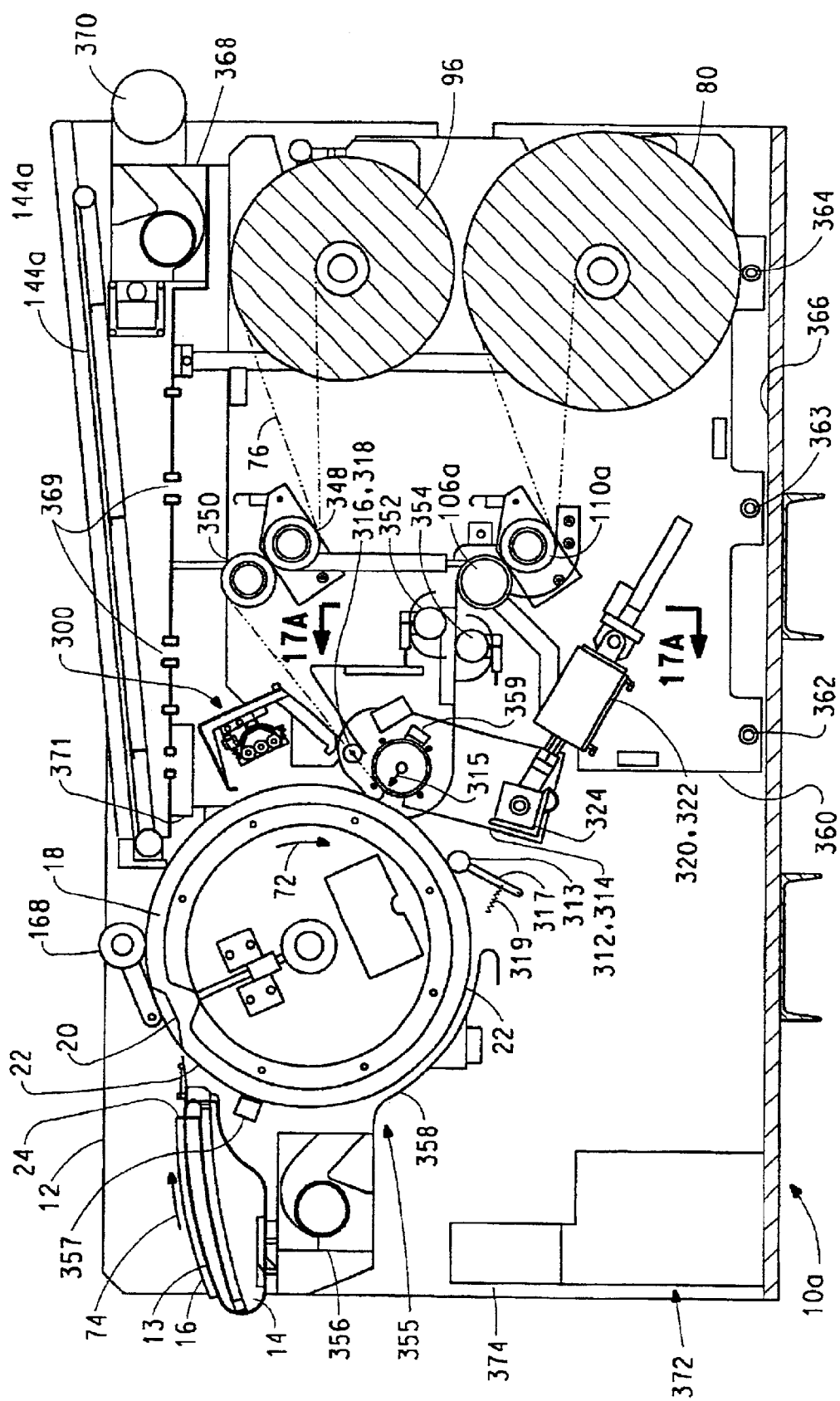
FIG. 15 is a side cross-sectional view partially in schematic of the second embodiment of the present invention.
Figure 16:
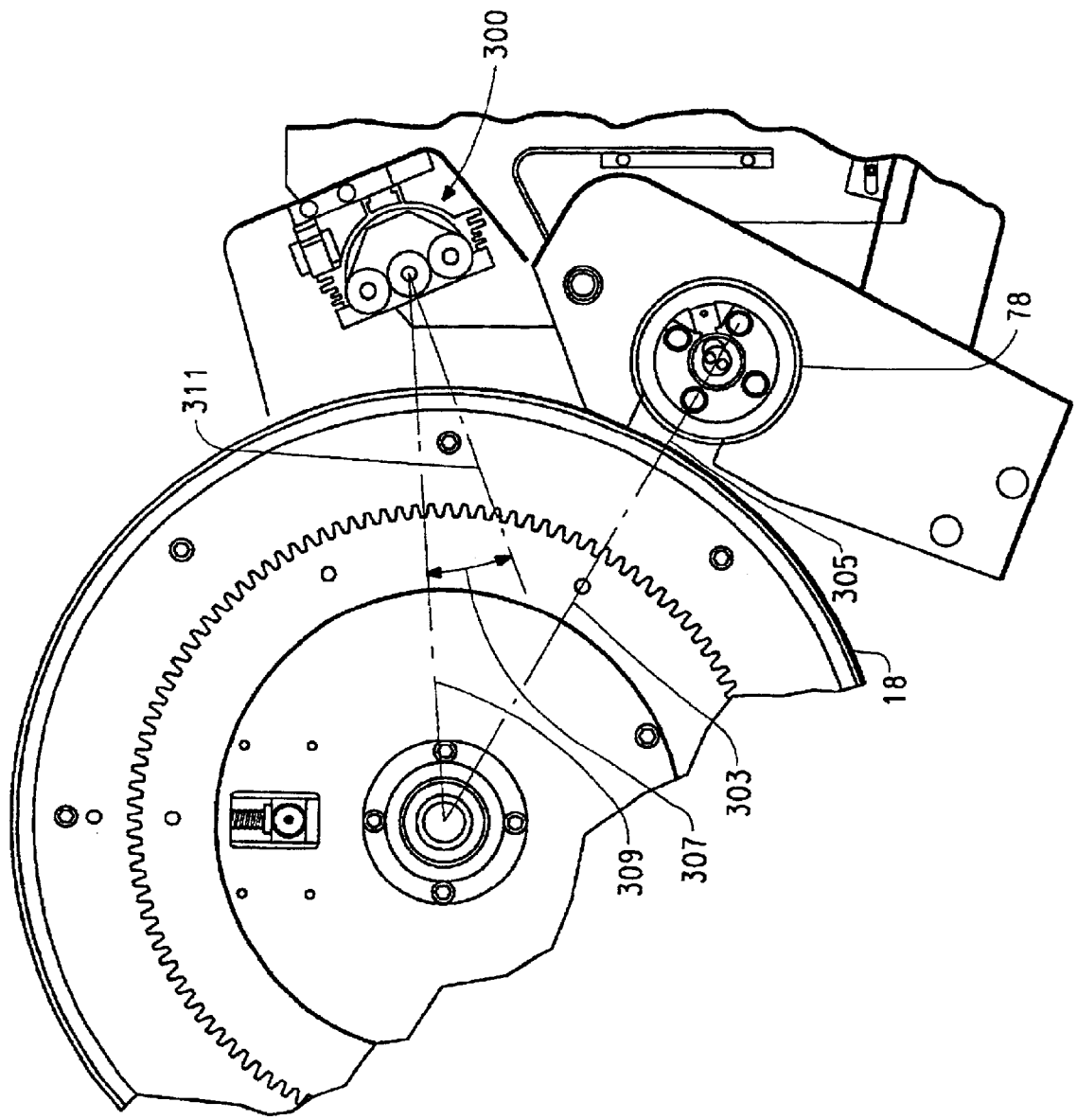
FIG. 16 is an enlarged view of a portion of FIG. 15.

FIG. 15 shows the second embodiment 10a similar to FIG. 6 of the first embodiment 10. As with FIG. 14, items similar to the first embodiment are numbered the same. The drum 18 is mounted for rotation on a stationary support frame 12 and rotates in a counterclockwise direction as indicated by arrow 72. A photosensitive element sheet 16 (shown in FIG. 14) is placed on a surface 13 of feed tray 14 and is urged in a direction indicated by arrow 74. The leading edge of a flexible sheet 16 is inserted into clamp 20. The sheet 16 remains substantially in contact with the surface 22 of the drum during processing. Located adjacent the drum 18 is a first heating means comprising a heater 300 which, in the embodiment illustrated, is a focussed radiant heater directed at the exterior surface 27 of the composition layer of the photosensitive element on the drum 18. The heater 300 elevates the temperature of the exterior surface 27 to a temperature T1, which is equal to or greater than a temperature T2 sufficient to melt the unirradiated portion of the composition layer, causing a portion of the layer to liquefy. The heater 300 is a type of heater that does not directly heat the flexible substrate 15 coated with the composition layer. The heater applies heat from the exterior surface side 27 of the composition layer 17, rather than the exterior surface side 23 of the flexible substrate 15 or from both surfaces 27 and 23, which allows the exterior surface 23 of the flexible substrate 15 to be maintained at a temperature T3 at least 20° F. below temperature T1 during thermal processing of a sheet 16. In the embodiment illustrate the heater 300 comprises a plurality of tubular infrared heating bulbs, such as bulbs 302, 304 and 306 mounted in end supports, such as support 308, that also provide electrical connections to the bulbs. Adjacent the side of the bulbs opposite drum 18 is a reflector 310 that acts to focus and direct the infrared radiation toward the exterior surface 27 of the composition layer 17 of the photosensitive element sheet 16 on the drum 18. Referring to FIG. 16, the heater in this second embodiment has its line of symmetry, indicated by line 311, angled away from a radial line 309 passing through the center of the heater bulbs and center of the drum by an angle 307. This directs the radiation from heater 300 closer toward the nip 305 between the drum 18 and the hot roller 78, the nip lying along the radial line 303 connecting the centers of the drum and hot roller. In the second embodiment of FIG. 15, angle 307 is about 15 degrees; in the first embodiment angle 307 (not shown) would be 0 degrees.

The plate processor 10a includes a delivery means for feeding a continuous web 76 of nonwoven material, which in the preferred embodiment contacts a hot roller 78. The hot roller 78 is positioned adjacent the heater 300, and the roller 78 maintains or further elevates the temperature of the exterior surface 27 of the composition layer to temperature T4, which may be at or exceeding the melt temperature T2 sufficient to melt the unirradiated portion of the composition layer to cause a portion of the layer to liquefy. The hot roller 78 applies heat from the exterior surface side 27 of the composition layer 17, which allows the exterior surface 23 of the flexible substrate 15 to be maintained at the temperature T3 which is also at least 20° F. below temperature T4. The heating to temperature T1 and the heating to temperature T4 must both individually and cumulatively be such as to maintain the flexible substrate 15 below temperature T3 that would distort flexible substrate 15. It is believed that a distortion of the substrate of more than 0.02%–0.1% at the development temperature T3 is enough to cause problems in the end use. Due to thermal inertia of the materials making up the photosensitive element, the non-steady state temperature T3 may be reached at different times than the non-steady state temperatures T1 and T4. Unlike the first embodiment, in the second embodiment the hot roller 78 is mounted to arms 312 and 314 for pivoting about pivots 316 and 318, under the urging of actuators 320 and 322 which are also seen in FIG. 17A. Actuators 320 and 322 are attached to beam 324, which on one end 326 is attached to arm 312 with two resilient bushings 328 and 330; and on the opposite end 332, beam 324 is attached to arm 314 with two resilient bushings 334 and 336. Although two actuators 320 and 322 are shown acting in unison to urge beam 324, a single larger or higher pressure actuator could be used in the center of beam 324 to accomplish the same function. The arms 312 and 314 function as moveable frame 102 did in the first embodiment of FIG. 8 for providing relative motion between the drum 18 and hot roller 78.

FIG. 17B illustrates the manner in which the bushings connect beam 324 to the arms 312 and 314. FIG. 17B shows hollow cylindrical bushing 330 which passes through a hole 338 in arm 312 and is abutted against end 326 of beam 324. A shoulder bolt 340 is passed through washer 342 and through hollow passage 344 in bushing 330 and is engaged in a threaded hole 346 in end 326 of beam 324. The bolt 340, when fully threaded into hole 346 so the shoulder 340a is tightly abutted against end 326, axially compresses resilient bushing 330 which causes the bushing 330 to radially expand to snuggly, but resiliently, engage the hole 338 in arm 312. The use of two such bushings on each end of the beam prevents rotation of the beam 324 relative to the arms 312 and 314. The bushings on each end of the beam permit small independent movement of each arm as the actuators act on the beam to urge the attached hot roller 78 toward drum 18 in the direction of arrow 315 to press the absorbent web against the photosensitive element. This permits self alignment of the hot roller with the photosensitive element on the drum, and eliminates the need for precise mechanical alignment of the hot roller with the drum, which is difficult to achieve.

Below the hot roller 78 and closely adjacent thereto is an idler roller 313 mounted to a swing arm on each end, such as swing arm 317 that is pivotally attached to frame 12. Each swing arm is biased toward the drum 18 by springs, such as spring 319 attached to frame 12 on one end and to arm 315 on the opposite end. The idler roller 313 is continuously urged toward drum 18 to press the photosensitive element sheet 16 against the drum as it exits the hot roller and the absorbent web is being stripped off the sheet 16. It is desirable to press the trailing edge of the sheet against the drum after it leaves the hot roller to keep it from peeling away from the drum under the influence of gravity.

The threadup path for the absorbent web 76 is slightly different between the first embodiment 10 and the second embodiment 10a as seen in FIGS. 6 and 15 respectively. In FIG. 15, web 76 is unwound from a supply roll 96 and passes between rolls 348 and 350 in a serpentine path. Supply roll 96 is connected to a light friction brake to maintain light unwind tension on the web 76. Roll 350 is connected to an electromagnetic brake and roll 348 is a spring biased nip roll; this combination of rolls acts to apply operating tension to the web 76 independently of the supply roll brake. The web 76 is then guided over the hot roller 78 and over drive roller 106a and idler roller 110a, which is another spring biased nip roll. The combination of rollers 106a and 110a act similarly to rollers 106 and 110 of the first embodiment (see FIG. 8A) to drive the web at a controlled surface speed that matches the surface speed of the sheet 16 on drum 18. The web is then wound up on take up roll 80. Drive roller 106a is driven by a motor 108a that also drives take up roll 80 through a magnetic particle clutch to maintain light winding tension on the web.

Another significant difference in the second embodiment compared to the first embodiment is the addition of ultra-violet lamps 352 and 354 that are directed to one and the other side of the web 76 to cure the liquefied composition layer absorbed in the web 76 being conveyed away from the drum 18. This curing helps minimize the accumulation of liquefied composition on the drive and idler rollers for the web 76. Such UV lamps can be obtained from Voltarc Technologies, Inc., model No. FR30T8/BL9/BP/180, located in Fairfield, Conn. 06430.

In the second embodiment, a cooling means 355 is provided which comprises a blower 356 and an optional shroud 358 arranged to extend from the blower in a direction around the drum 18 in close proximity to the surface 22 of the drum. The cooling means is positioned where the photosensitive element sheet 16 is separated from the absorbent material web 76 for cooling the photosensitive element sheet. The blower directs a stream of air at the surface of the sheet 16 on the drum 18, and the shroud 358 (optional) directs the stream of air around a portion of the drum in a direction opposite the direction of rotation of the drum. Such a blower can be obtained from EBM/Pabst Company, model QK08B-2EM.70.CH, in Farmington, Conn. 06034. One other embodiment of a cooling means is to circulate a cooling fluid beneath the drum support surface 22 to cool the flexible substrate 15 by direct contact. This may be used as another embodiment instead of cooling means 355 or may supplement it. If such a cooling means is employed, the drum temperature stabilization by heating mentioned above, referring to the heater 21 in the first embodiment of FIG. 6, would not be employed; the drum temperature could be stabilized by cooling instead.

Figure 19:
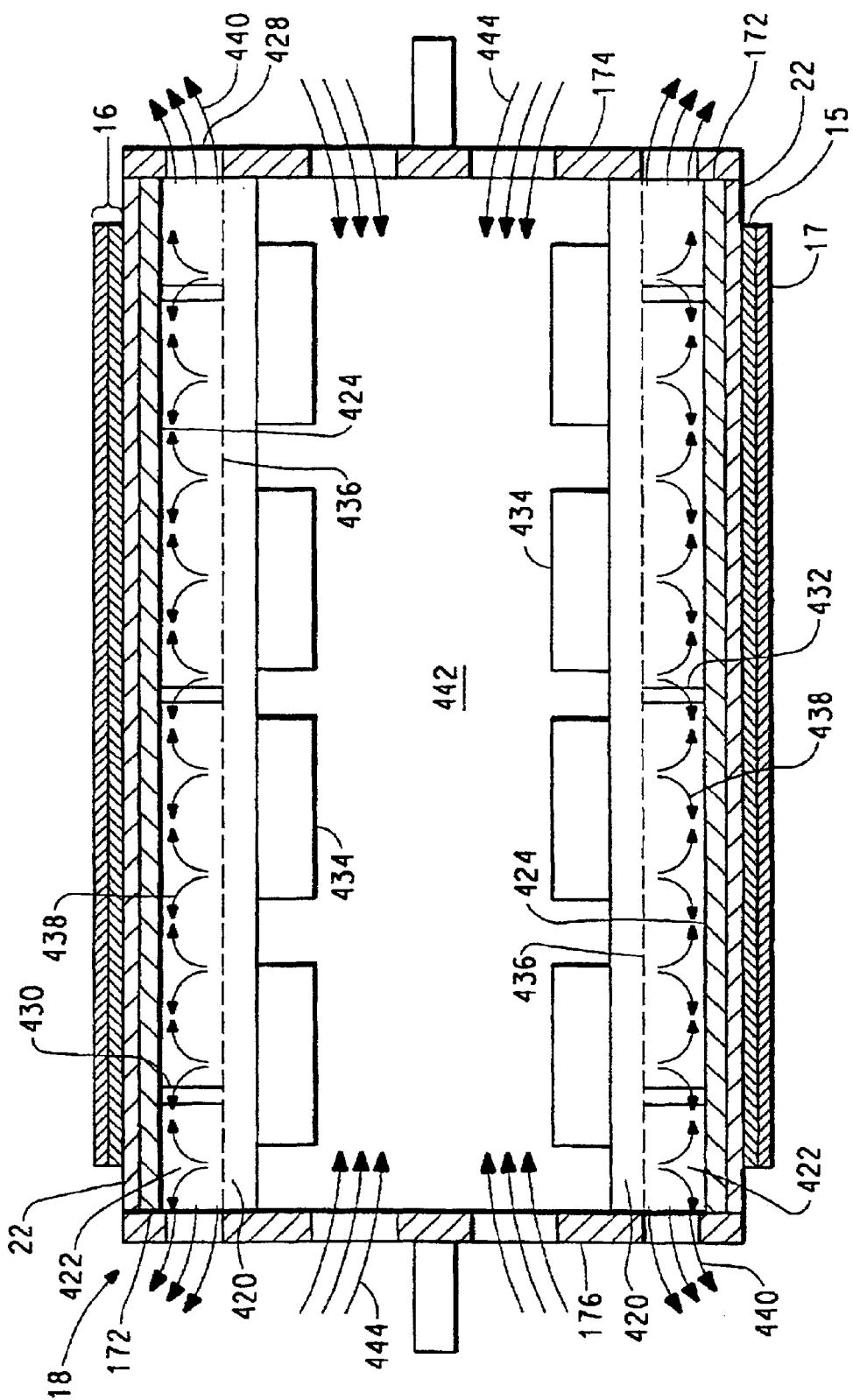
FIG. 19 is a side cross-sectional view partially in schematic of an alternate cooling embodiment for the drum.

Another embodiment of a cooling means comprises forceably circulating cooling gases, such as air, through the interior of the drum structure 18 of the first or second embodiments. FIG. 19 illustrates one such arrangement where an annular plenum 420 and passage 422 are provided adjacent the inner surface 424 of the wall portion 172 of the drum 18. The passage 422 extends around a substantial portion of the perimeter surface area of the inner surface 424 except where the sheet clamp 20 (FIGS. 6 and 15) would be located. The passage is open at the axial ends 426 and 428. The plenum 420 extends around a substantial portion of the passage 422 and is attached to the inner surface 424 by a plurality of standoffs, such as standoffs 420 and 432, and hubs 174 and 176. Cooling air is forced into the plenum 420 by a plurality of electrically powered fans 434. The air passes through a plurality of orifices 436 in the plenum and into the annular passage 420 as illustrated generally by arrows, such as arrows 438. The impingement of air from the orifices 436 directly on the inner surface 424 increases the heat transfer from the surface 424 according to the known "air impingement jet cooling" effect. From the passage 420, the air exits the drum at the ends as illustrated generally by arrows, such as arrows 440. Fresh air is provided to the fans through the interior 442 of drum 18 as illustrated generally by arrows, such as arrows 444. The circulation of air adjacent the inner surface 424 of the drum 18 removed heat from the main wall portion 172 and the outer surface 22. A sheet 16 of photosensitive element is mounted on the outer surface 22 of the main wall portion 172 of the drum 18, the element comprising a flexible substrate 15 in contact with the outer surface 22 and a composition layer 17. The element 16 is cooled by the removal of heat from the wall portion 172 and the outer surface 22 with the flexible substrate being cooled to a temperature lower than the composition layer.

Temperature sensors are mounted adjacent the drum and hot roll to monitor the roll temperature for the purpose of controlling the heating elements in the drum and hot roll, respectively. They are also monitored by the machine controller to determine when the machine is warmed up and ready to start. Referring to FIG. 15, sensor 357 is placed adjacent the lateral end surface or edge of the surface 22 of drum 18 at a position just after the cooling means 355. This sensor is an infrared sensor that can be obtained from Electronic Development Lab, Inc., Danville, Va. 24540, model CI-1-B, Type J, 0-500 C. The sensor is supported by attachment to frame 12. Referring also to FIG. 17A, sensor 359 is placed adjacent the lateral edge of the surface of the hot roll at the back of the hot roll 78 opposite drum 18, which is not wrapped by the web 76. The sensor is supported by attachment to arm 312. It is similar to the drum sensor 357. It is used to monitor the actual hot roll temperature that may be changed by the controller at the beginning of the processing for a sheet 16 or during one of the processing cycles for a sheet 16.

For maintenance purposes, the absorbent web rolls 96 and 80, and guide system of rolls 348, 350, 78, 106a, and 110a, and hot roll actuating system involving elements 320, 322, 324, 312, 314 are all mounted on a cart 360 that can be rolled out of the main machine frame 12 when required for servicing. The cart has wheels, such as wheels 362, 363, and 364 that ride on a baseplate 366 of frame 12, or can ride on the same support floor where frame 12 is resting if no baseplate is provided. The machine frame 12 is ventilated by a vacuum fan unit 368, which forms a plenum with the underpart of conveyor 144a, to control fumes from heating the composition layer on sheet 16. The exhaust from the unit 368 is vented through conduit 370. The inlets for the unit 368 are along the bottom of the unit such as through a plurality of inlets 369 and at the end of the unit at inlet 371.

A brief discussion of one preferred operation of the second embodiment is discussed below referring to the figures and in particular FIG. 15. In this regard, it is pointed out that the plate processor 10a of FIGS. 14 and 15 has a programmable logic controller (PLC) 372 located within frame 12 and connected to control console 50 (FIG. 14). The controller 372 includes a modem 374 for connection to an external data communication network. The modem 374 makes it possible to remotely collect operating data from, and provide commands to, the controller 372. The plate processor 10a is in the home position with the drum stationary with the clamp 20 positioned near the top of the drum adjacent the feed tray. The operator places a sheet 16 on feed tray 14. The operator then enters information about the sheet using the keypad on the console 50. Such information is the chemical formulation of the sheet (used by the controller 372 to determine the appropriate temperature and pressure to use), the total thickness of the sheet (used to determine rpm of the drum based on a predetermined surface speed for the sheet), the sheet width (used to set the pressure for the hot roll), and the desired relief depth for the finished the sheet (or plate) (used to determine the required number of cycles or passes of the sheet under the hot roll).

The operator then opens clamp 20 and engages the leading edge 24 of the sheet 16 in clamp 20 and pushes a button on the console 50 to cause the clamp 20 to close on the leading edge of the sheet 16. The controller then begins warming up the processor 10a and when warm, notifies the operator with a "ready" light. The drum heater 21 or the IR heater 300 may be used to preheat the drum 18. The cartridge heater (not shown) for the hot roll is used to preheat the hot roll 78. The operator then pushes a "start" button on the console. The drum starts turning and carries the sheet with it; idler roller 168 (also functioning as steady roller 92 as in the first embodiment) is spring loaded toward drum 18 to press the sheet against surface 22 on the drum. As the trailing edge of the flexible sheet 16 passes the leading edge of the feed tray, a switch 90 (similar to the first embodiment discussed referring to FIG. 4) generates a signal which is sent to and processed by the controller 372 to compute a "length" for the sheet and determine the location of the trailing end of the sheet. The heater 300 is energized at full power to preheat the bulbs before the sheet reaches the heater. The encoder (or gear tooth sensor) on the drum tells the controller when the clamp holding the leading edge of the sheet 16 reaches the leading edge of the heater 300 and the power is switched to the operating setting to achieve the desired temperature T1 for melting the composition layer on sheet 16. As the leading edge of the sheet reaches the position where the hot roll will contact the drum, the controller signals the hot roll actuators to pivot the hot roll against the sheet 16 and signals the drive roller 106a to drive the web 76 at a speed that matches the surface speed of the sheet on the drum, based on a calculated surface speed related to the sheet thickness. To assure precision control of speed and position of the drum and hot roll, the motors driving each of these elements are AC induction motors.

As the trailing edge of the sheet 16 passes the hot roll/drum contact point, the controller may turn off or turn down the power to the heater 300 (based on the sheet length and heater operating characteristics), signals the actuators 320 and 322 to retract the hot roll and signals the drive roller 106a to stop driving the web. At the same time, the controller may also signal the drum to speed up to return the leading edge of the sheet 16 to the home position to begin another cycle. In cases where the sheet has a short length, this speed up of the drum saves processing time; in cases where the sheet has a long length, this speed up may be eliminated since the leading edge may already be at the home position or beyond by the time the trailing edge passes the hot roll/drum contact point. For long sheets, the heater 300 may also be left on to eliminate the full power heat-up suggested for the first cycle. It may also be desired to leave the heater 300 on continuously at operating power for the remaining cycles required for the selected sheet, regardless of the sheet length. In one embodiment, the second cycle would be the same as the first cycle for the case of a sheet with a short length. The cooling blower 356 and ventilation blower 368 would be turned on as the start button is actuated and would remain on for the total cycles required.

It is contemplated that the operation of the plate processor can be varied by permitting the controller 372 to change the machine operating parameters, such as drum speed, heater power, hot roll power, hot roll pressure, and cooling air volume (blower speed) for each cycle of the photosensitive element sheet. In some cases, the cooling medium temperature may also be varied. The parameters may be changed from one cycle to the next, or held constant for several cycles and changed, or have one setting for the first cycle, another setting for the intermediate cycles and another setting for the last cycle. The setting changes can be predetermined based on experimental data gathered over several of the same type and size sheets or the settings can be changed in real-time based on changes in the monitored temperatures of the drum and hot roll.

The use of a heater 300 that directly heats the composition layer to a temperature T1, sufficient to melt the composition while maintaining the flexible substrate at a temperature T3 that is at least 20 F below T1 and heating the composition layer with a hot roll to a temperature T4, sufficient to melt the composition while maintaining the flexible substrate at the temperature T3 that is at least 20° F. below T4 is a significant improvement over the systems of the prior art.

TEST RESULTS

Temperature Studies

Figure 18A:
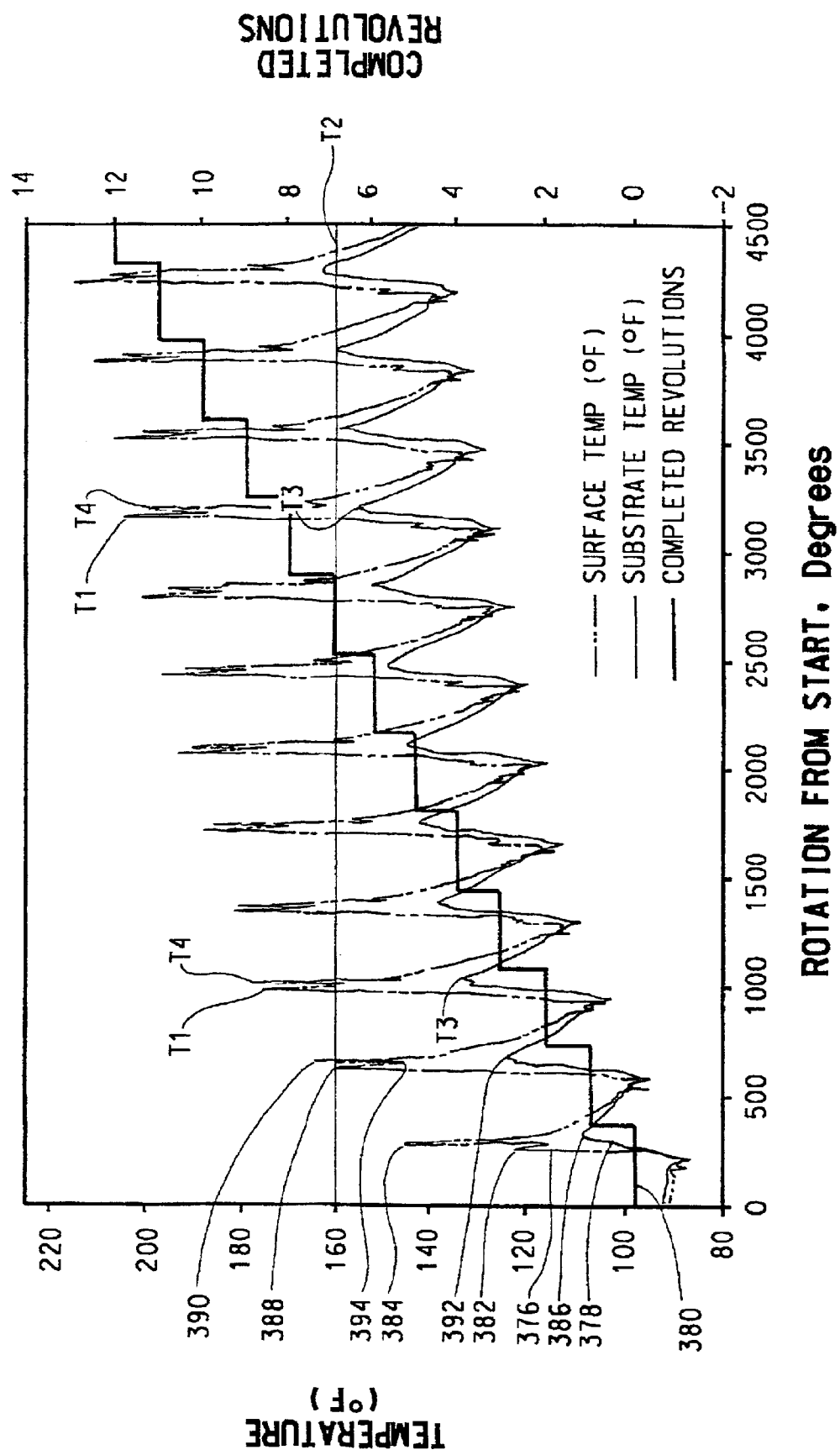
FIG. 18A is a plot of temperature versus drum rotation from the start of a process having IR and hot roller heating with substrate and composition layer temperatures recorded.

FIG. 18A illustrates the temperature history of a process that explored the thermal behavior of the system. The plate processor used resembled the second embodiment with the IR heater positioned as in the first embodiment and without a blower shroud. A drum with the thick rubber coating embodiment was used. In a first situation referring to FIGS. 18A and 18B, the cooling means is not employed, and the ventilation unit is operating continuously. To record the temperatures, a first thermocouple was situated on the exterior surface 23 of the flexible substrate of a sheet 16 and a second thermocouple was situated on the external surface 27 of the composition layer of the same sheet. Both thermocouples were in the center of a fully irradiated (cured) sheet area of a sheet 30 inches wide and 40 inches long. The sheet was 0.067 inches thick with a 5 mil thick flexible substrate. None of the composition layer was meltable, so no relief was created during this test. The sheet was then processed for 12 cycles and the temperature recorded for the two thermocouples to simulate a photosensitive element that might require 12 cycles of operation to remove the desired amount of composition layer. In operation of the processor, the heater 300 was turned on at the start at a set point of 30% power for a 5400 watt heater that resulted in about a 790° F. (420° C.) temperature at the surface of the bulbs. At 20% power the bulb temperature is about 660° F. (350° C.). A hot roll pressure of 60 psi to the actuators was employed that resulted in a pressure exerted on the sheet of about 59.4 pounds per linear inch of width. The hot roll (developer roll) temperature was set to be 235F which produced a composition surface temperature T4 for absorption (greater than estimated melt temperature T2 of about 160° F.) of between 170 to 210° F. The surface speed of the sheet on the drum was set to be 30 inches per minute. The temperatures T1 and T4 of the exterior surface of the composition layer measured by the second thermocouple is plotted as curve 376 and the temperature T3 of the exterior surface of the flexible substrate measured by the first thermocouple is plotted as curve 378. The stairstep curve 380 represents the number of completed revolutions or cycles. The vertical axis is the thermocouple temperatures in degrees F and the horizontal axis is the rotational position of the drum starting with 0 degrees at the home position and continuing cumulatively.

During the first cycle, the exterior surface of the composition layer reached a temperature of about 118° F. at position 382 directly under the IR heater 300, and a temperature of about 146° F. as it passed under the hot roll 78 at position 384. During the same first cycle, the flexible substrate temperature reached about 109° F. just after leaving the nip of the hot roll 78 at position 386. During this first cycle, the composition layer did not reach a temperature sufficient to liquefy the uncured portion of the composition layer, and it can be seen that the IR heater 300 was not up to temperature.

In the second cycle, the composition layer reached a temperature under the IR heater of about 162° F. at 388 and a temperature under the hot roll of about 164° F. at 390; the flexible substrate temperature just past the hot roll reached a maximum of about 123° F. at 392. The melt point of the composition layer was reached and the IR heater seemed to be up to temperature. Notice there is a dip in temperature between the IR heater and the hot roll at 394 which is believed to be because the heater 300 was oriented in this test as in FIG. 6 where it is aimed directed at the drum surface. This dip in temperature at 394 can be seen more clearly in FIG. 18B, which is an enlarged scale of the last three temperature cycles of FIG. 18A where the dip is shown at 394*a*. In FIG. 15, the angle of the heater 300 is changed to aim it toward the nip between the hot roll and drum which is expected to minimize the dip in temperate of the composition surface between the heater 300 and hot roll 78. This minimized dip would be a more desireable condition of operation where the temperature established by the heater 300 is maintained with minimal dip 394, 394*a* until the composition layer encounters the hot roll 78.

In the third and succeeding cycles the temperature of the composition layer gradually increased, as did the temperature of the flexible substrate. The flexible substrate maximum temperature remained about 38° F. below the maximum temperature under the heater 300 and about 41° F. below the maximum temperature under the hot roll during the second cycle. This temperature spread increased with each cycle and by the last cycle, the flexible substrate maximum temperature was about 162° F. at 396 which remained about 53° F. below the maximum temperature under the heater 300 of 215° F. at 398 and about 46° F. below the maximum temperature under the hot roll 78 of 208° F. at 400 during the last cycle.

Figure 18B:
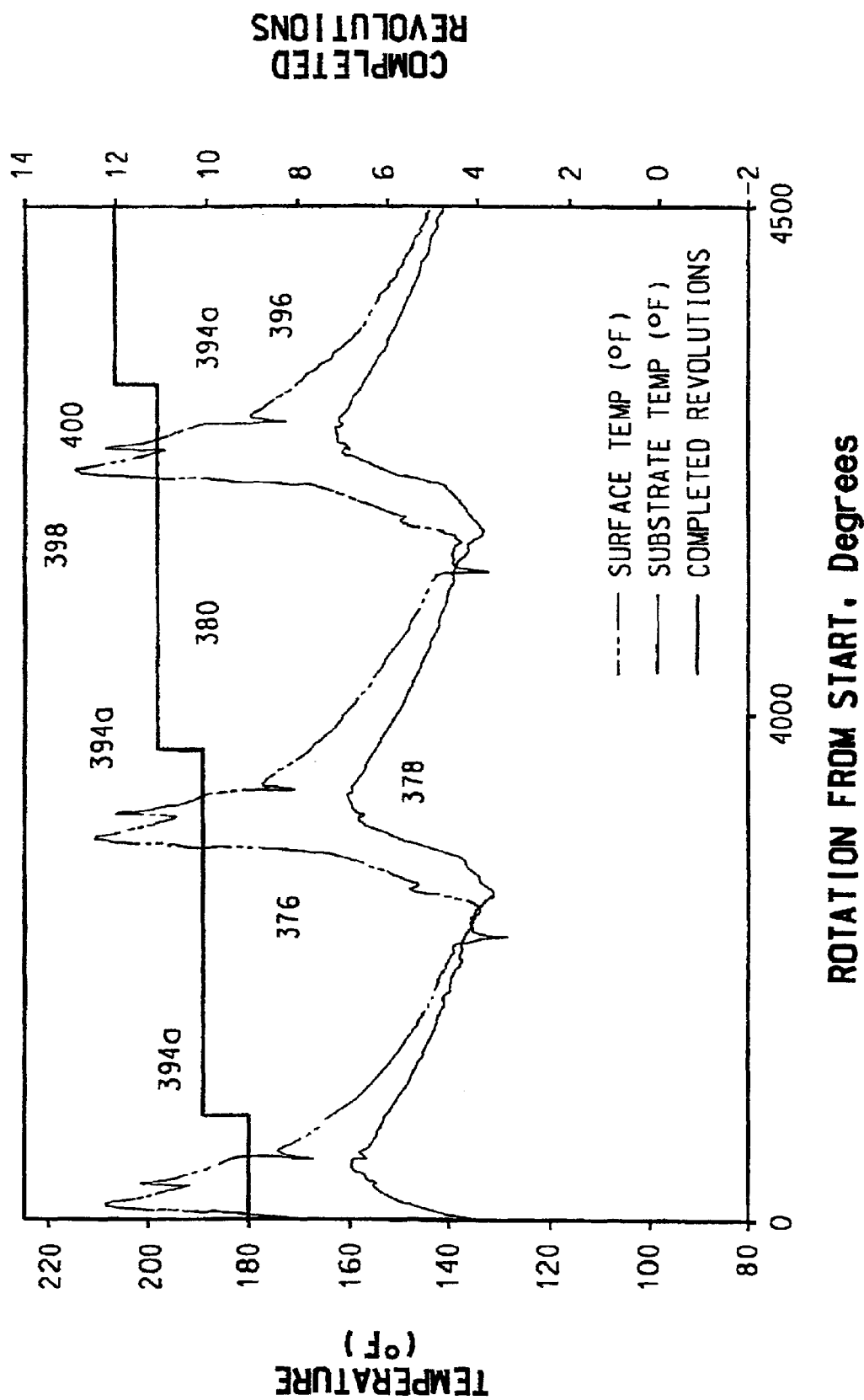
FIG. 18B is an enlarged portion of FIG. 18A.
Figure 18C:
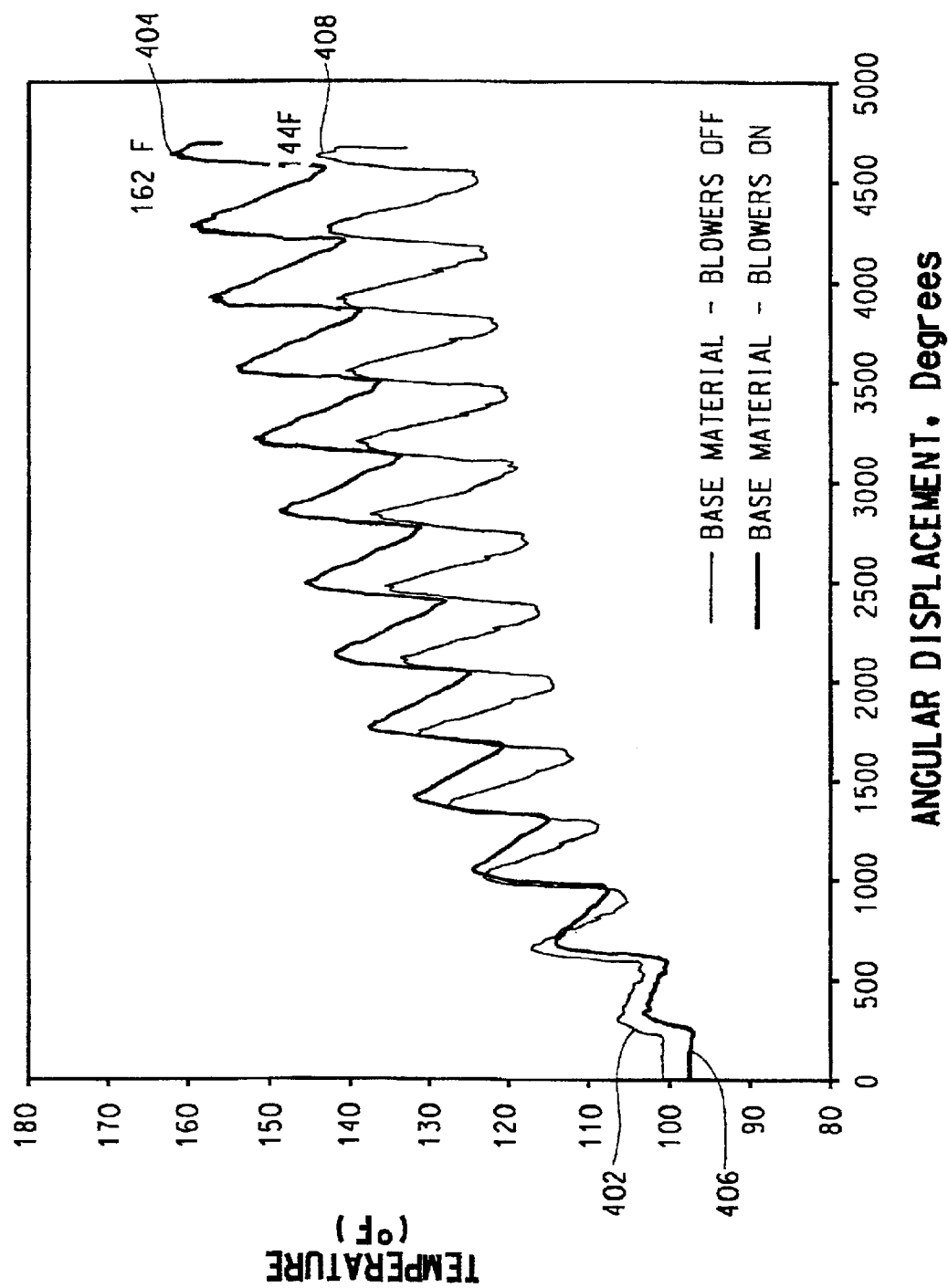
FIG. 18C is a plot of temperature versus drum rotation from the start of a process having IR heating only with substrate temperature recorded with and without cooling.
Figure 18D:
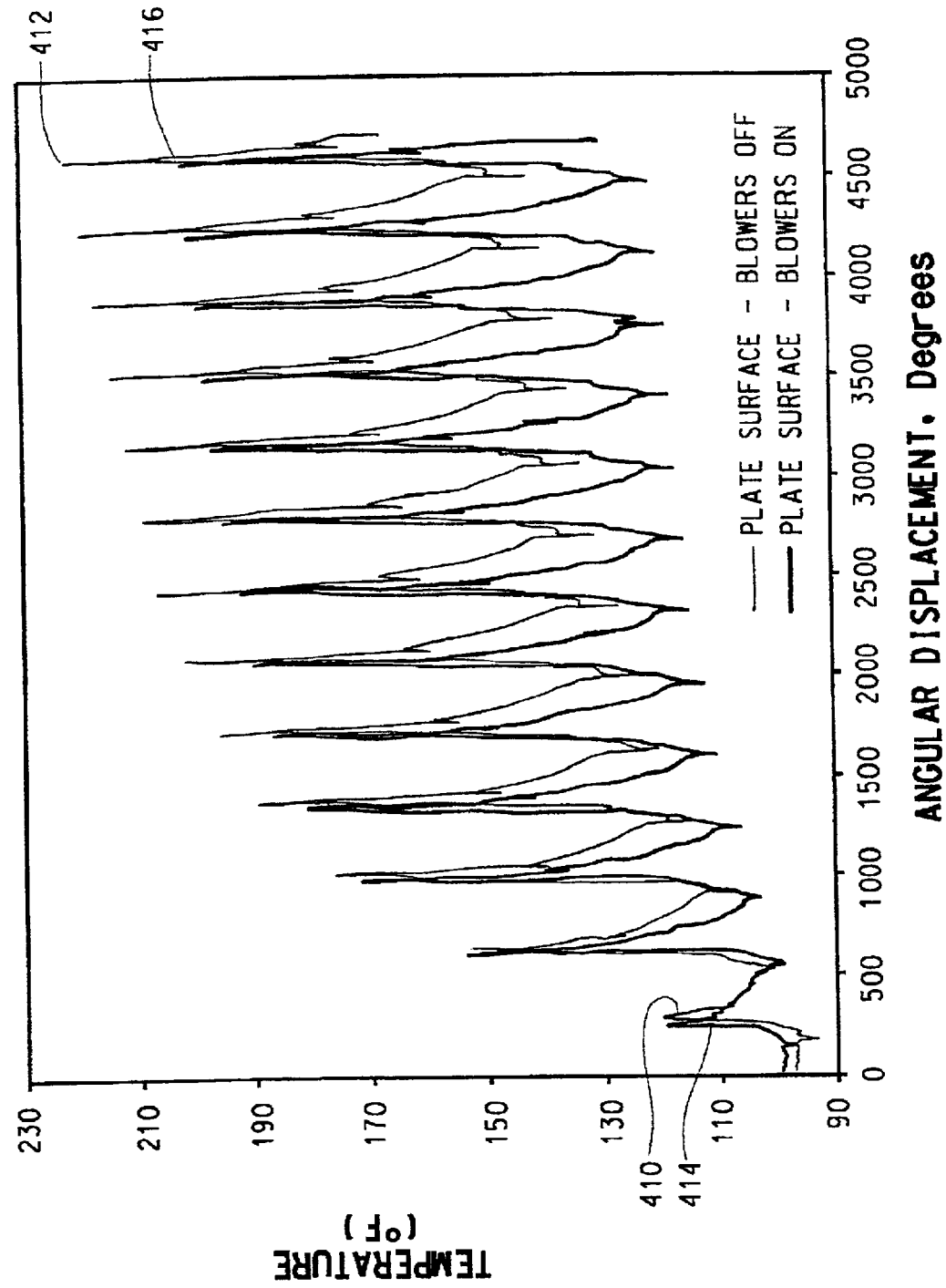
FIG. 18D is a plot of temperature versus drum rotation from the start of a process having IR heating only with composition temperature recorded with and without cooling.

The effect of cooling on the operation of the plate processor used referring to FIGS. 18A and 18B is illustrated in FIGS. 18C and 18D. The same photosensitive element with thermocouples used for FIGS. 18A and 18B is used to collect data for FIGS. 18C and 18D. FIG. 18C shows the temperature history of the flexible substrate with only IR heating and no hot roll heating of the composition layer. Curve 402 shows the temperature of the exterior surface 23 of the substrate 15 (FIG. 1) during repeated cycles of operation with the blower turned off. The temperature of the substrate continued rising steadily until a temperature of about 162° F. was reached at 404. Curve 406 shows the temperature of the exterior surface of the substrate during repeated cycles of operation with the blower turned on continuously. Curve 406 is plotted offset to the right slightly to avoid direct overlap with curve 402 for clarity. The temperature of the substrate rose at a lower rate than curve 402 until a temperature of about 144° F. was reached at 408. The cooling effect was to lower the maximum temperature of the substrate by 18° F. The cooling effect also acts to lower the temperature of the composition layer as is illustrated in FIG. 18D. Curve 410 shows the temperature of the exterior surface 27 of the substrate 17 (FIG. 1) during repeated cycles of operation with the blower turned off. The temperature of the composition surface continued rising steadily until a temperature of about 225° F. was reached at 412. Curve 414 shows the temperature of the exterior surface of the composition layer during repeated cycles of operation with the blower turned on continuously. Curve 410 is plotted offset to the right slightly to avoid direct overlap with curve 414 for clarity. The temperature of the composition surface rose at a lower rate than curve 410 until a temperate of about 205° F. was reached at 416. The blower in the case of the substrate and composition layer served to flatten out the slope of temperate increase which should result in more uniform temperatures and in the case of the substrate, the maximum temperature of the substrate was reduced which should be beneficial in reducing substrate thermal distortion.

Performance Studies

Scouting test experiments were performed to explore the effects to radiant heating of the composition layer and the variations possible in operating parameters from one cycle to the next on the temperature of the flexible substrate and quality of the flexographic plate. The plate processor used resembled the second embodiment with the IR heater positioned as in the first embodiment and without a blower shroud. Test conditions and results are reported below:

Conditions common to all experiments are as below unless noted otherwise:

CYREL™ flexographic printing plate type PLS available from E. I. du Pont de Nemours and Company of Wilmington, Del. was used as the photosensitive element. The plates were 10 inches wide, 20 inches long and 0.067 inches thick. The substrate is 0.005 inches thick polyester. For this particular plate type in these experiments, it is believed that significant absorption of the composition layer occurs at about 180° F. and better absorption occurs at about 200° F. and beyond.

All plates were irradiated the same using a 2001E exposure unit, available from E. I. du Pont de Nemours and Company of Wilmington, Del., according to the following conditions:

a standard 120 line per inch test target including 30 mil wide recessed lines was used;

back irradiation was given for 15 seconds to develop a floor;

front irradiation was given for 5 minutes all over;
a first portion of the target was covered and front irradiation was given for 5 more minutes;
the first and a second portion of the target was covered and front irradiation was given for 5 more minutes;
the first, second, and a third portion of the target was covered and front irradiation was given for 5 more minutes;
the first, second, third and a fourth portion of the target was covered and front irradiation was given for 5 more minutes;

Drum heater turned off by placing the setpoint at room temperature;

Ventilation system on;

Cooling blower on and providing about 140 cfm of room temperature air flow;

Exterior surface temperature of the composition layer on the plate is measured about 3 inches (20 degrees of rotation) down from the hot roll nip position using an IR surface temperature probe aimed at the center of the plate. The maximum number observed as the plate passes the probe is recorded. It is believed this temperature is about 20° F. lower than the exterior surface temperature of the composition layer in the hot roll nip based on the data in FIG. 18A. Temperature is recorded as Max Surf Temp;

Exterior surface temperature of the flexible substrate on the plate is measured by placing two temperature tapes in the center of the exterior surface of the flexible substrate about 2 inches in from the trailing edge of the plate. One tape measured temperatures from 100–150° F. with steps at 100, 115, 110, 115, 120, 130, 140, 150. The other tape measured temperatures from 160–230° F. with steps every 10° F. Temperature is recorded as Max Base Temp;

The IR lamps are turned on at 100% power at the start of the first cycle and are turned down to the set point power as the leading edge of the plate reaches the leading edge of the IR heater. The IR remains on continuously at the set point for the remaining cycles for a given plate. Changes in the IR set point occur as the leading edge of the plate reaches the leading edge of the IR heater;

Changes in the drum speed occur as the leading edge of the plate reaches the leading edge of the IR heater;

Pressure is that supplied to cylinders acting on the pivot arms for the hot roll. Pounds per linear inch exerted on the plate is the normalized pressure parameter, and for this particular machine embodiment an approximation of that value can be calculated from the relationship:

$$PLI = 29.7(\text{psi pressure})/(\text{inches of plate width})$$

| Cycle | Dev Roll (° F.) | Pressure (psi) | IR Bulbs Power (%) | Temp (° F.) | Speed (in/min) | Max Surf Temp (° F.) | (° C.) |
|---|---|---|---|---|---|---|---|
| Experiment 1 ||||||||
| 1 | 300 | 40 | 0 | 72 | 40 | 138 | 58.8 |
| 2 | 300 | 40 | 0 | 72 | 40 | 142 | 61.3 |
| 3 | 300 | 40 | 0 | 72 | 40 | 142 | 61.3 |
| 4 | 300 | 40 | 0 | 72 | 40 | 145 | 62.5 |
| 5 | 300 | 40 | 0 | 72 | 40 | 145 | 62.5 |
| 6 | 300 | 40 | 0 | 72 | 40 | 145 | 62.5 |
| 7 | 300 | 40 | 0 | 72 | 40 | 142 | 61.3 |
| 8 | 300 | 40 | 0 | 72 | 40 | 142 | 61.3 |
| 9 | 300 | 40 | 0 | 72 | 40 | 145 | 62.5 |
| Max Base Temp 105–109° F. || 119 pli || Comment: IR off ||||
| Experiment 2 ||||||||
| 1 | 300 | 40 | 30 | 790 | 40 | 145 | 63 |
| 2 | 300 | 40 | 30 | 790 | 40 | 167 | 75 |
| 3 | 300 | 40 | 30 | 790 | 40 | 182 | 83.1 |
| 4 | 300 | 40 | 30 | 790 | 40 | 185 | 85 |
| 5 | 300 | 40 | 30 | 790 | 40 | 190 | 87.5 |
| 6 | 300 | 40 | 30 | 790 | 40 | 193 | 89.4 |
| 7 | 300 | 40 | 30 | 790 | 40 | 196 | 91.3 |
| 8 | 300 | 40 | 30 | 790 | 40 | 199 | 92.5 |
| 9 | 300 | 40 | 30 | 790 | 40 | 199 | 92.5 |
| Max Base Temp 170–179° F. || 119 pli || Comment: Basepoint ||||
| Experiment 3 ||||||||
| 1 | 300 | 40 | 30 | 790 | 40 | 159 | 70.7 |
| 2 | 300 | 40 | 30 | 790 | 40 | 176 | 80 |
| 3 | 300 | 40 | 30 | 790 | 40 | 192 | 88.8 |
| 4 | 300 | 40 | 30 | 790 | 40 | 201 | 93.8 |
| 5 | 300 | 40 | 30 | 790 | 40 | 206 | 96.9 |
| 6 | 300 | 40 | 30 | 790 | 40 | 211 | 99.4 |
| 7 | 300 | 40 | 30 | 790 | 40 | 214 | 101.3 |
| 8 | 300 | 40 | 30 | 790 | 40 | 218 | 103.2 |
| 9 | 300 | 40 | 30 | 790 | 40 | 220 | 104.4 |
| Max Base Temp 170–179° F. || 119 pli || Comment: Blower\off ||||
| Experiment 4 ||||||||
| 1 | 300 | 25 | 20 | 663 | 40 | 142 | 61.3 |
| 2 | 300 | 25 | 20 | 663 | 40 | 147 | 63.8 |
| 3 | 300 | 25 | 20 | 663 | 40 | 147 | 63.8 |
| 4 | 300 | 25 | 20 | 663 | 40 | 147 | 63.8 |
| 5 | 300 | 25 | 20 | 663 | 40 | 149 | 65 |
| 6 | 300 | 25 | 20 | 663 | 40 | 149 | 65 |
| 7 | 300 | 25 | 20 | 663 | 40 | 149 | 65 |
| 8 | 300 | 25 | 20 | 663 | 40 | 149 | 65 |
| 9 | 300 | 25 | 20 | 663 | 40 | 147 | 63.8 |
| Max Base Temp 115–119° F. || 74 pli || Comment: Low IR - Low psi ||||
| Experiment 5 ||||||||
| 1 | 300 | 30 | 10 | 470 | 60 | 122 | 50 |
| 2 | 300 | 30 | 10 | 470 | 60 | 139 | 59.4 |
| 3 | 300 | 30 | 10 | 470 | 60 | 140 | 60 |
| 4 | 300 | 35 | 20 | 663 | 45 | 146 | 63.2 |
| 5 | 300 | 35 | 20 | 663 | 45 | 147 | 63.8 |
| 6 | 300 | 35 | 20 | 663 | 45 | 147 | 63.8 |
| 7 | 300 | 40 | 25 | 731 | 30 | 156 | 68.8 |
| 8 | 300 | 40 | 25 | 731 | 30 | 172 | 77.5 |
| 9 | 300 | 40 | 25 | 731 | 30 | 185 | 85 |
| Max Base Temp 140–149° F. || 89, 104, 119 pli || Comment: Cycle change1: IR, spd, press ||||
| Experiment 6 ||||||||
| 1 | 300 | 30 | 30 | 790 | 60 | 140 | 60 |
| 2 | 300 | 30 | 30 | 790 | 60 | 156 | 68.8 |
| 3 | 300 | 30 | 20 | 663 | 60 | 160 | 71.3 |
| 4 | 300 | 35 | 20 | 663 | 45 | 160 | 71.3 |
| 5 | 300 | 35 | 20 | 663 | 45 | 160 | 71.3 |
| 6 | 300 | 35 | 20 | 663 | 45 | 154 | 67.5 |
| 7 | 300 | 40 | 25 | 731 | 30 | 163 | 72.5 |
| 8 | 300 | 40 | 25 | 731 | 30 | 173 | 78.3 |
| 9 | 300 | 40 | 25 | 731 | 30 | 187 | 86.3 |
| Max Base Temp 150–159° F. || 89, 104, 119 pli || Comment: Cycle change2: IR, spd, press ||||

Results of Experiments

The relief is the distance from an irradiated (cured) surface of the composition layer to a broad surface where liquefied composition has been absorbed. The relief is measured in inches. The relief is measured at the portion of the pattern for each different irradiation time.

The reverse line is indicated by the depth at the center of a 30 mil wide groove (line) in an irradiated surface of the composition where composition has been absorbed from the groove. The reverse is measured in microns (1 micron= 0.000039 inch). The reverse is measured at a portion of the pattern for each different irradiation time.

In the summary of the experiments, Hi Max Surf Temp is the highest value of Max Surf Temp for a given IR setting, and is just shown for reference.

Goals for good quality results for these experiments are:

Max Base Temp—less than about 150° F.

Relief—about 0.020 inch

Reverse line—about 100 microns

| Experiment | 1 | 2 | 3 | 4 | 5 | 6 |
|---|---|---|---|---|---|---|
| IR (%) | 0 | 30 | 30 | 20 | 10–20–25 | 30–20–25 |
| Press. (psi) | 40 | 40 | 40 | 25 | 30–40 | 30–40 |
| Max Base Temp (F) | 105–109 | 170–179 | 170–179 | 115–119 | 140–149 | 150–159 |
| Hi Max surf. Temp (F) | 145 | 199 | 220 | 149 | 140–147–185 | 156–160–187 |
| Relief obtained (inches) | | | | | | |
| avg. all times | 0.012 | 0.018 | 0.017 | 0.009 | 0.011 | 0.013 |
| Depth of 30 mil reverse line (microns) | | | | | | |
| Reverse 5 | 286 | 282 | 283 | 196 | 263 | 279 |
| Reverse 10 | 156 | 192 | 168 | 105 | 178 | 163 |
| Reverse 15 | 79 | 105 | 87 | 89 | 92 | 91 |
| Reverse 20 | 74 | 72 | 71 | 59 | 69 | 62 |
| Reverse 25 | 52 | 57 | 62 | 27 | 57 | 56 |

Conclusions About Experiments

Experiment 1 suggests that the use of a hot roll only is not adequate to heat the composition layer to a temperature for good absorption. For the conditions of this experiment, the Max Surf Temp is low and the relief at all times is low.

Experiment 2 suggests that the use of IR at a 30% level for the entire 9 cycles produces excess heating of the substrate with the level of cooling employed. The composition layer seems to be heated adequately for acceptable relief and reverse at a 5–15 minute irradiation. Perhaps more cooling should be employed by increasing the flow of the cooling blower.

Experiment 3 suggests that additional heating of the composition layer compared to Experiment 2 is not beneficial since no improvement in relief or reverse is noted. Since the substrate temperature tape is the same, perhaps the tape is at the high end of the range for Experiment 3 (179° F.) and at the low end for Experiment 2 (170° F.). This experiment shows the effect of cooling on the Max Surf. Temp.

Experiment 4 suggests that an IR level of 20% is not much better for relief than no IR as in Experiment 1, or the advantage of more heat over Experiment 1 is offset by a pressure too low for good absorption. Pressure should probably be greater than 25 psi.

Experiments 5 and 6 indicate that varying process parameters from one cycle to the next can significantly change the Max Surf Temp and Max Base Temp compared to Experiment 2 and may be beneficially used to optimize the process. The use of a radiant heater for providing a portion of the heat to the composition layer is beneficial since it is a heater with relatively low thermal inertia that can quickly respond to changes from one cycle to another. This rapid response is especially evident in Experiments 5 and 6 looking at the changes in Max Surf Temp with changes in IR power.

What is claimed is:

1. An apparatus for forming a relief pattern from a photosensitive element comprising a flexible substrate having an exterior surface and an interior surface, and a composition layer on the substrate capable of being partially liquefied, the composition layer having an exterior surface and an interior surface, with the composition layer and flexible substrate joined at their respective interior surfaces, comprising:

a roller mounted for rotation in a first frame portion for supplying an absorbent material to the exterior surface of the composition layer;

a drum mounted for rotation in a second frame portion with means for supporting the photosensitive element on an outer circumferential surface of the drum with the exterior surface of the flexible substrate contacting said outer surface, the drum positioned for delivering the photosensitive element to the absorbent material, wherein at least one of the first and second frame portions are movable relative to the other;

first heating means for applying heat to the exterior surface of the composition layer on the drum adjacent where the absorbent material contacts the layer at the roller, the first heating means adapted to heat the exterior surface of the layer to a temperature T1 which is equal to or greater than a temperature T2 sufficient to cause a portion of the layer to liquefy, while maintaining the exterior surface of the flexible substrate at a temperature T3 at least 20° F. below temperature T1;

second heating means for heating the roller to a temperature capable of heating the exterior surface of the composition layer to a temperature T4 which is equal to or greater than temperature T2 while the absorbent material is contacting the exterior surface of the layer and while maintaining the exterior surface of the flexible substrate at the temperature T3 which is at least 20° F. below temperature T4;

pressure means for causing the photosensitive element and the absorbent material to come into contact between the drum and the roller at a pressure sufficient for at least a portion of the liquefied material of the composition layer to be absorbed by the absorbent material; and separation means for separating the photosensitive element from the absorbent material.

2. The apparatus of claim 1 further comprising a forced cooling means for cooling the photosensitive element.

3. The apparatus of claim 2 wherein the cooling means comprises means for cooling the circumferential surface of the drum that contacts the flexible substrate.

4. The apparatus of claim 2 wherein the forced cooling means is disposed at a location where the element is separated from the absorbent material.

5. The apparatus of claim 1 wherein the first heating means comprises an infrared heating device.

6. The apparatus of claim 5 further comprising:

a sensor for sensing the temperature of the infrared heating device; and a controller for controlling power to the infrared heating device to maintain the sensed temperature at a preselected temperature.

7. A method for forming a relief pattern from a photosensitive element comprising a flexible substrate having an exterior surface and an interior surface, and a composition layer on the substrate capable of being partially liquefied, the composition layer having an exterior surface and an interior surface, with the composition layer and flexible substrate joined at their respective interior surfaces, comprising:

supporting the element with the exterior surface of the flexible substrate in contact with an outer circumferential surface of a drum mounted for rotation in a second frame portion;

contacting an absorbent material to the exterior surface of the composition layer by passing the material over an exterior surface of a roller mounted for rotation in a first frame portion, wherein at least one of the first and second frame portions are moveable relative to the other;

heating the exterior surface of the composition layer to a temperature T1 which is equal to or greater than a temperature T2 sufficient to cause a portion of the layer to liquefy, while maintaining the exterior surface of the flexible substrate at a temperature T3 at least 20° F. below temperature T1;

heating the absorbent material to a temperature capable of heating the exterior surface of the composition layer to a temperature T4 which is equal to or greater than temperature T2;

pressing the absorbent material against the composition layer by urging the first frame portion supporting the roller and the second frame portion supporting the drum toward each other at a pressure sufficient for the heated absorbent material to liquefy at least a portion of the exterior surface of the layer and to absorb the liquefied material;

maintaining the exterior surface of the flexible substrate at a temperature T3 at least 20° F. below temperature T4 during said pressing and heating of the absorbent layer; and separating the photosensitive element from the absorbent material, thereby removing the absorbed liquefied material from the photosensitive element.

8. The method of claim 7, further comprising maintaining the exterior surface of the layer at temperature T2 between the step of heating the surface to a temperature T1 and the pressing step.

9. The method of claim 7, further comprising cooling the photosensitive element on the drum.

10. The method of claim 9 wherein the cooling step is performed at a location where the element is separated from the absorbent material.

11. The method of claim 9, wherein cooling comprises cooling the outer circumferential surface of the drum that contacts the exterior surface of the flexible substrate.

12. The method of claim 7, wherein the contacting step further comprises mounting the roller in the first frame portion so that the roller is resiliently supported to freely align the roller surface with the exterior surface of the composition layer during the pressing step.

13. The method of claim 7 wherein the composition layer comprises a photosensitive layer and an infrared-sensitive mask layer, wherein a surface of the infrared-sensitive mask layer opposite the photosensitive layer is the exterior surface of the composition layer, and a surface of the photosensitive layer opposite the infrared-sensitive layer is the interior surface of the composition layer.

14. A method for forming a relief pattern from a photosensitive element comprising a flexible substrate having an exterior surface and an interior surface, and a composition layer on the substrate capable of being partially liquefied, the composition layer having an exterior surface and an interior surface, with the composition layer and flexible substrate joined at their respective interior surfaces, comprising:

supplying an absorbent material to the exterior surface of the composition layer with a roller operating at a temperature Tr that heats the absorbent material;

delivering the photosensitive element to the absorbent material with a rotating drum and supporting the element with the exterior surface of the flexible substrate in contact with an outer circumferential surface of the drum, wherein each rotation of the drum defines a cycle;

heating the exterior surface of the composition layer sufficient to cause a portion of the layer to liquefy with a heater operating at a temperature Th;

pressing the photosensitive element and the heated absorbent material into contact between the drum operating at a rotation speed, S, and the roller at a pressure, P, sufficient for the heated absorbent material to liquefy at least a portion of the exterior surface of the composition layer and to absorb the liquefied material;

separating the photosensitive element from the absorbent material;

repeating the supplying, delivering, heating, pressing and separating steps for a predetermined number of cycles; and changing at least one of the process parameters selected from the group consisting of temperature of the roller Tr, temperature of the heater Th, pressure P, and rotation speed S, during at least one of the supplying, delivering, heating, and pressing steps for at least one of the predetermined number of cycles.

15. The method of claim 14, further comprising forcefully cooling the photosensitive element after separating the element from the absorbent material, by a cooling means having a temperature Tc wherein the repeating step includes the cooling step and the changing step includes the temperature Tc of the cooling means as one of the process parameters in the group.

16. The method of claim 14 wherein the composition layer comprises a photosensitive layer and an infrared-sensitive mask layer, wherein a surface of the infrared-sensitive layer opposite the photosensitive layer is the exterior surface of the composition layer, and a surface of the photosensitive layer opposite the infrared-sensitive layer is the interior surface of the composition layer.

17. In a method for producing a relief pattern comprising providing a photosensitive element comprising a flexible substrate having an exterior surface and an opposed surface having thereon a composition layer having an exterior surface, imagewise irradiating said layer to harden the composition in irradiated areas, contacting the exterior surface of said imagewise irradiated layer with an absorbent layer, heating said composition layer while in contact with said absorbent layer to a temperature sufficiently high to enable said composition in unirradiated areas to flow into said absorbent layer, and removing said absorbent layer and the composition from unirradiated areas from said photosensitive element, the improvement comprising:

maintaining the temperature of the exterior surface of the flexible substrate to a temperature at least 20° F. below the exterior surface temperature of the heated composition layer while in contact with said absorbent layer to control thermal distortion of the substrate.

18. The method of claim 17, further comprising:

heating the composition layer to a temperature between 40° C. and 200° C. before contacting said absorbent layer; and maintaining the exterior surface of the composition layer at said temperature until the absorbent layer is in contact with the composition layer.

19. A method of forming a flexographic printing plate from a photosensitive element comprising a flexible substrate having an exterior surface and an interior surface, at least one composition layer capable of being partially liquified and comprising a photosensitive layer and an infrared-sensitive layer, the photosensitive layer having an interior surface opposite the infrared-sensitive layer, with the photosensitive layer and the flexible substrate joined at their respective interior surfaces, the method comprising:

(a) exposing the infrared-sensitive layer imagewise with infrared laser radiation to form in-situ a mask having actinic radiation opaque areas on the photosensitive layer, the mask and the photosensitive layer not covered by the mask forming the exterior surface of the composition layer;

(b) exposing the photosensitive element of (a) with actinic radiation through the mask;

(c) treating the element of (b) with heat to form the relief pattern in the element, wherein the treating step is selected from a method I or II, wherein method I comprises:

supporting the element with the exterior surface of the flexible substrate in contact with an outer circumferential surface of a drum mounted for rotation in a second frame portion;

contacting an absorbent material to the exterior surface of the composition layer by passing the material over an exterior surface of a roller mounted for rotation in a first frame portion, wherein at least one of the first and second frame portions are moveable relative to the other;

heating the exterior surface of the composition layer to a temperature T1 which is equal to or greater than a temperature T2 sufficient to cause a portion of the layer to liquefy, while maintaining the exterior surface of the flexible substrate at a temperature T3 at least 20° F. below temperature T1;

heating the absorbent material to a temperature capable of heating the exterior surface of the composition layer to a temperature T4 which is equal to or greater than temperature T2;

pressing the absorbent material against the composition layer by urging the first frame portion supporting the roller and the second frame portion supporting the drum toward each other at a pressure sufficient for the heated absorbent material to liquefy at least a portion of the exterior surface of the layer and to absorb the liquefied material;

maintaining the exterior surface of the flexible substrate at a temperature T3 at least 20° F. below temperature T4 during said pressing and heating of the absorbent layer; and separating the photosensitive element from the absorbent material, thereby removing the absorbed liquefied material from the photosensitive element;

and, method II comprises:

supplying an absorbent material to the exterior surface of the composition layer with a roller operating at a temperature Tr that heats the absorbent material;

delivering the photosensitive element to the absorbent material with a rotating drum, operating at a rotation speed, S, and supporting the element with the exterior surface of the flexible substrate in contact with an outer circumferential surface of the drum, wherein each rotation of the drum defines a cycle;

heating the exterior surface of the composition layer sufficient to cause a portion of the layer to liquefy with a heater operating at a temperature Th;

pressing the photosensitive element and the heated absorbent material into contact between the drum and the roller at a pressure, P, sufficient for the heated absorbent material to liquefy at least a portion of the exterior surface of the composition layer and to absorb the liquefied material;

separating the photosensitive element from the absorbent material;

repeating the supplying, delivering, heating, pressing and separating steps for a predetermined number of cycles; and changing at least one of the process parameters selected from the group consisting of temperature of the roller Tr, temperature of the heater Th, pressure P, and rotation speed S, during at least one of the supplying, delivering, heating, and pressing steps for at least one of the predetermined number of cycles.

* * * * *